(12) United States Patent
Holland et al.

(10) Patent No.: US 8,900,403 B2
(45) Date of Patent: Dec. 2, 2014

(54) SEMICONDUCTOR PROCESSING SYSTEM HAVING MULTIPLE DECOUPLED PLASMA SOURCES

(75) Inventors: John Patrick Holland, San Jose, CA (US); Peter L. G. Ventzek, San Francisco, CA (US); Harmeet Singh, Fremont, CA (US); Richard Gottscho, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 637 days.

(21) Appl. No.: 13/104,925

(22) Filed: May 10, 2011

(65) Prior Publication Data

US 2012/0289054 A1    Nov. 15, 2012

(51) Int. Cl.
   *H01L 21/3065*   (2006.01)
   *C23F 1/08*      (2006.01)
   *H01J 37/32*     (2006.01)

(52) U.S. Cl.
   CPC ..... *H01J 37/32082* (2013.01); *H01J 37/32633* (2013.01); *H01J 347/32899* (2013.01)
   USPC ............ 156/345.38; 156/345.29; 156/345.33; 156/345.48; 257/E21.218

(58) Field of Classification Search
   USPC ................................................ 257/E21.218
   See application file for complete search history.

(56) References Cited

U.S. PATENT DOCUMENTS

| | | |
|---|---|---|
| 4,382,186 A | 5/1983 | Denholm et al. |
| 4,871,421 A | 10/1989 | Ogle et al. |
| 5,083,061 A | 1/1992 | Koshiishi et al. |
| 5,248,371 A | 9/1993 | Maher et al. |
| 5,601,653 A | 2/1997 | Ito |
| 5,604,401 A | 2/1997 | Makishima |
| 5,656,141 A | 8/1997 | Betz et al. |
| 5,904,780 A | 5/1999 | Tomoyasu |
| 5,942,854 A | 8/1999 | Ryoji et al. |
| 6,127,275 A | 10/2000 | Flamm |
| 6,368,678 B1 | 4/2002 | Bluck et al. |
| 6,787,010 B2 | 9/2004 | Cuomo et al. |
| 7,094,315 B2 | 8/2006 | Chen et al. |
| 7,632,379 B2 | 12/2009 | Goto et al. |

(Continued)

OTHER PUBLICATIONS

D. Söderström et al., "Time Evolution of the Space-Charge Sheath in an RF Hollow Cathode", Journal of Physics: Conference Series 100 (2008) 062020, pp. 5 total.

(Continued)

*Primary Examiner* — Parviz Hassanzadeh
*Assistant Examiner* — Nathan K Ford
(74) *Attorney, Agent, or Firm* — Martine Penilla Group, LLP

(57) ABSTRACT

A semiconductor substrate processing system includes a chamber that includes a processing region and a substrate support. The system includes a top plate assembly disposed within the chamber above the substrate support. The top plate assembly includes first and second sets of plasma microchambers each formed into the lower surface of the top plate assembly. A first network of gas supply channels are formed through the top plate assembly to flow a first process gas to the first set of plasma microchambers to be transformed into a first plasma. A set of exhaust channels are formed through the top plate assembly. The second set of plasma microchambers are formed inside the set of exhaust channels. A second network of gas supply channels are formed through the top plate assembly to flow a second process gas to the second set of plasma microchambers to be transformed into a second plasma.

19 Claims, 23 Drawing Sheets

(56) References Cited

U.S. PATENT DOCUMENTS

| | | | |
|---|---|---|---|
| 7,872,406 | B2 | 1/2011 | Matacotta |
| 2004/0163763 | A1 | 8/2004 | Martin et al. |
| 2005/0105580 | A1 | 5/2005 | Giapis et al. |
| 2006/0042752 | A1 | 3/2006 | Rueger |
| 2006/0042755 | A1 | 3/2006 | Holmberg et al. |
| 2006/0054279 | A1 | 3/2006 | Kim et al. |
| 2007/0034497 | A1 | 2/2007 | Chistyakov |
| 2007/0281105 | A1 | 12/2007 | Mokhlesi et al. |
| 2008/0008640 | A1 | 1/2008 | Watanabe et al. |
| 2008/0135518 | A1 | 6/2008 | Chen et al. |
| 2008/0314523 | A1* | 12/2008 | Iizuka ............... 156/345.34 |
| 2009/0061640 | A1 | 3/2009 | Wong et al. |
| 2009/0149028 | A1 | 6/2009 | Marakhtanov et al. |
| 2009/0218212 | A1 | 9/2009 | Denpoh et al. |
| 2010/0068870 | A1 | 3/2010 | Ovshinsky |
| 2010/0184299 | A1 | 7/2010 | Takahashi |
| 2010/0221922 | A1 | 9/2010 | Rueger et al. |
| 2010/0243604 | A1 | 9/2010 | Lee et al. |
| 2010/0267247 | A1 | 10/2010 | Ma et al. |
| 2011/0005681 | A1* | 1/2011 | Savas et al. ............ 156/345.33 |
| 2011/0053381 | A1 | 3/2011 | Kobayashi et al. |
| 2011/0132874 | A1 | 6/2011 | Gottscho et al. |

OTHER PUBLICATIONS

H.S. Lee et al., "Effective Design of Multiple Hollow Cathode Electrode to Enhance the Density of RF Capacitively Coupled Plasma", Applied Physics Letters 97, 081503 (2010), © 2010 American Institute of Physics, pp. 3 total.

Thomas Deconinck et al., "Modeling of Mode Transition Behavior in Argon Microhollow Cathode Discharges", Plasma Processes and Polymers, 2009, 6, pp. 335-346.

Kazunori Koga et al., "Highly Stable a-Si:H Films Deposited by Using Multi-Hollow Plasma Chemical Vapor Deposition", © 2005 Japanese Journal of Applied Physics, vol. 44, No. 48, pp. L1430-L1432.

Shiratani et al., Journal of Physics: Conference Series 86 (2007) 012021.

F. Fietzke et al., "Plasma Characterization and Technological Application of a Hollow Cathode Plasma Source with an Axial Magnetic Field", Surface and Coatings Technology 205 (2010) 1491-1496.

Japanese Journal of Applied Physics, 48 (2009).

M. Ikegawa et al., "Scale-up of a Parallel Plate RF Plasma Etching Reactor by Using Reactive Gas Flow Simulations", Journal of the Electrochemical Society, vol. 148, No. 8, G456-G464, 2001.

PCT/US2012/030069, International Search Report and Written Opinion.

PCT/US2012/030072, International Search Report and Written Opinion.

PCT/US2012/036762, International Search Report and Written Opinion.

PCT/US2012/067737, International Search Report and Written Opinion.

V.A. Godyak, "Electrical Characteristics of Parallel-Plate RF Discharges in Argon", IEEE Transactions on Plasma Science, vol. 19, No. 4 (660), Aug. 1991, pp. 660-676.

Rosenman et al., "Electron Emission from Ferroelectrics," Journal of Applied Physics, vol. 88, No. 11, Dec. 1, 2000.

Paranjpe et al., "Atomic Layer Deposition of AlOx for Thin Film Head Gap Applications," Journal of the Electrochemical Society, 148 (9) G465-G471, Jul. 16, 2001.

* cited by examiner

View A-A

View A-A

View A-A

View A-A

View B-B

View B-B

View B-B

View B-B

View C-C

View B-B

View B-B

View B-B

SEMICONDUCTOR PROCESSING SYSTEM HAVING MULTIPLE DECOUPLED PLASMA SOURCES

CROSS-REFERENCE TO RELATED APPLICATIONS

This application is related to U.S. patent application Ser. No. 13/104,923, filed on an even date herewith, and entitled "Semiconductor Processing System Having Multiple Decoupled Plasma Sources," which is incorporated herein by reference in its entirety.

BACKGROUND OF THE INVENTION

Plasma sources utilized for thin film processing in semiconductor device fabrication are often unable to achieve the most desirable condition for dry etching due to the inability to separately control ion and radical concentrations in the plasma. For example, in some applications, the desirable conditions for plasma etching would be achieved by increasing the ion concentration in the plasma while simultaneously maintaining the radical concentration at a constant level. However, this type of independent ion concentration versus radical concentration control cannot be achieved using the common plasma source typically used for thin film processing. It is within this context that the present invention arises.

SUMMARY OF THE INVENTION

In one embodiment, a semiconductor substrate processing system is disclosed. The system includes a plate assembly having a process-side surface exposed to a plasma processing region. An exhaust channel is formed through the process-side surface of the plate assembly to provide for removal of exhaust gases from the plasma processing region. A plasma microchamber is formed inside the exhaust channel. Also, a gas supply channel is formed through the plate assembly to flow a process gas to the plasma microchamber in the exhaust channel. And, a power delivery component is formed within the plate assembly to transmit power to the plasma microchamber, so as to transform the process gas into a plasma within the plasma microchamber in the exhaust channel.

In another embodiment, a semiconductor substrate processing system is disclosed. The system includes a chamber having a top structure, a bottom structure, and sidewalls extending between the top and bottom structures. The chamber includes a processing region. A substrate support is disposed within the chamber. The substrate support has a top surface defined to support a substrate in exposure to the processing region. The system also includes a top plate assembly disposed within the chamber above the substrate support. The top plate assembly has a lower surface exposed to the processing region and opposite the top surface of the substrate support. The top plate assembly includes a first set of plasma microchambers each formed into the lower surface of the top plate assembly. The top plate assembly also includes a first network of gas supply channels formed to flow a first process gas to each of the first set of plasma microchambers. Each of the first set of plasma microchambers is defined to transform the first process gas into a first plasma in exposure to the processing region. The top plate assembly also includes a set of exhaust channels formed through the lower surface of the top plate assembly to provide for removal of exhaust gases from the processing region. The top plate assembly also includes a second set of plasma microchambers respectively formed inside the set of exhaust channels. The top plate assembly further includes a second network of gas supply channels formed to flow a second process gas to each of the second set of plasma microchambers. Each of the second set of plasma microchambers is defined to transform the second process gas into a second plasma in exposure to the processing region.

In another embodiment, a method is disclosed for processing a semiconductor substrate. The method includes an operation for placing a substrate on a substrate support in exposure to a processing region. The method also includes operating a first set of plasma microchambers in exposure to the processing region, whereby each of the first set of plasma microchambers generates a first plasma and supplies reactive constituents of the first plasma to the processing region. The first set of plasma microchambers are located above the processing region opposite from the substrate support. The method also includes operating a second set of plasma microchambers in exposure to the processing region, whereby each of the second set of plasma microchambers generates a second plasma and supplies reactive constituents of the second plasma to the processing region. The second plasma is different than the first plasma. And, the second set of plasma microchambers are located above the processing region opposite from the substrate support. The second set of plasma microchambers are interspersed in a substantially uniform manner among the first set of plasma microchambers.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 2F-1 shows another variation of the system of FIG. 2A in which the power delivery components of the first and second plasma chambers are implemented as electrodes disposed on sidewalls within the first and second plasma chambers, in accordance with one embodiment of the present invention;

FIG. 2F-2 shows another variation of the system of FIG. 2A in which the power delivery components of the first and second plasma chambers are implemented as electrodes disposed on upper and lower surfaces within the first and second plasma chambers, in accordance with one embodiment of the present invention;

DETAILED DESCRIPTION

Figure 1:
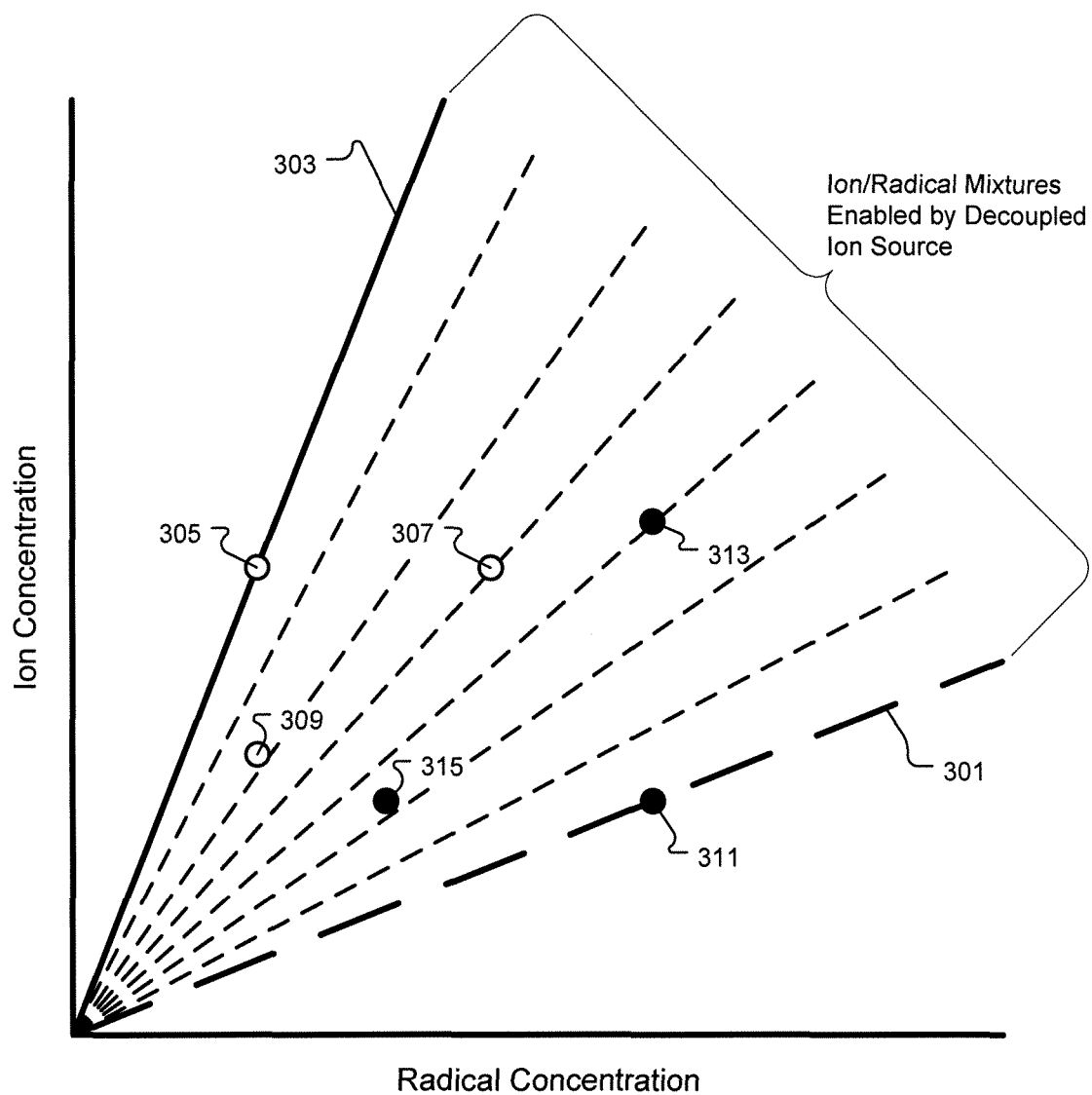
FIG. 1 shows relationships between ion concentration and radical concentration achievable with use of multiple plasma chambers in exposure to a common substrate processing region, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Various embodiments of the present invention include two or more types of plasma generating devices, such as plasma chambers, that can be independently operated using separate control parameters in order to achieve decoupled control of ion and radical concentrations within a plasma processing region to which the two or more types of plasma generating devices are fluidly connected, with a substrate to be processed disposed within the plasma processing region. For example, in one embodiment, a first plasma chamber can be operated to generate a first plasma that has a higher radical concentration than ion concentration. Also, in this example embodiment, a second plasma chamber can be operated to generate a second plasma that has a higher ion concentration than radical concentration. Both the first and second plasma chambers are fluidly connected to a same substrate processing region, such that the first plasma chamber is operated to control an amount of radical constituents within the substrate processing region, and such that the second plasma chamber is operated to control an amount ion constituents within the substrate processing region. In this manner, the first plasma chamber is controlled to tune the ion concentration in the substrate processing region, and the second plasma chamber is controlled to tune the radical concentration in the substrate processing region.

In one embodiment, the term "substrate" as used herein refers to a semiconductor wafer. However, it should be understood that in other embodiments, the term "substrate" as used herein can refer to substrates formed of sapphire, GaN, GaAs or SiC, or other substrate materials, and can include glass panels/substrates, metal foils, metal sheets, polymer materials, or the like. Also, in various embodiments, the "substrate" as referred to herein may vary in form, shape, and/or size. For example, in some embodiments, the "substrate" as referred to herein may correspond to a 200 mm (millimeters) semiconductor wafer, a 300 mm semiconductor wafer, or a 450 mm semiconductor wafer. Also, in some embodiments, the "substrate" as referred to herein may correspond to a non-circular substrate, such as a rectangular substrate for a flat panel display, or the like, among other shapes. The "substrate" referred to herein is denoted in the various example embodiment figures as substrate 105.

Independent operation of multiple plasma chambers to provide reactive constituents to a common substrate processing region provides for substantially decoupled adjustment of ion concentration relative to radical concentration within the common substrate processing region. In various embodiments, generation of the different types of plasmas within the multiple plasma chambers is achieved through independent control of the power supplies and/or gas supplies associated with the multiple plasma chambers. Also, in some embodiments, outputs of the multiple plasma chambers can be disposed in a spatial array in fluid communication with the substrate processing region. The outputs of the multiple plasma chambers can be interspersed with each other and spaced in sufficiently close proximity to each other, such that the different reactive constituents of the different types of plasmas formed within the multiple plasma chambers are supplied to the substrate processing region in a substantially uniform manner so as to affect a substantially uniform processing of a substrate within the substrate processing region.

FIG. 1 shows relationships between ion concentration and radical concentration achievable with use of multiple plasma chambers in exposure to a common substrate processing region, in accordance with one embodiment of the present invention. A first line 301 shows a variation of ion concentration versus radical concentration in a first plasma generated in a first plasma chamber in fluid connection to the common substrate processing region. In this example the first plasma has a higher radical concentration than ion concentration. A second line 303 shows a variation of ion concentration versus radical concentration in a second plasma generated in a second plasma chamber in fluid connection to the common substrate processing region. In this example the second plasma has a higher ion concentration than radical concentration. Therefore, the first plasma is generated to primarily supply radical constituents to the substrate processing region, and the second plasma is generated to primarily supply ion constituents to the substrate processing region.

Through independent control of the first and second plasma chambers, essentially any ion concentration versus radical concentration within the domain extending between the first line 301 and the second line 303 is achievable within the substrate processing region. For example, the second plasma chamber can be operated alone to supply a first ion-to-radical concentration ratio 305 within the substrate processing region. When used together, the first plasma chamber can be operated to increase the radical concentration within the substrate processing region while the second plasma chamber is operated to maintain a substantially steady ion concentration within the substrate processing region, thereby creating a second ion-to-radical concentration ratio 307 within the substrate processing region that is not achievable with either the first or second plasma chamber alone. Similarly, when used together, the second plasma chamber can be operated to decrease the ion concentration within the substrate processing region while the first plasma chamber is operated to maintain a substantially steady radical concentration within the substrate processing region, thereby creating a third ion-to-radical concentration ratio 309 within the substrate processing region that is not achievable with either the first or second plasma chamber alone.

Further with regard to FIG. 1, the first plasma chamber can be operated alone to supply a fourth ion-to-radical concentration ratio 311 within the substrate processing region. When used together, the second plasma chamber can be operated to increase the ion concentration within the substrate processing region while the first plasma chamber is operated to maintain a substantially steady radical concentration within the substrate processing region, thereby creating a fifth ion-to-radical concentration ratio 313 within the substrate processing region that is not achievable with either the first or second plasma chamber alone. Similarly, when used together, the first plasma chamber can be operated to decrease the radical concentration within the substrate processing region while the second plasma chamber is operated to maintain a substantially steady ion concentration within the substrate processing region, thereby creating a sixth ion-to-radical concentration ratio 315 within the substrate processing region that is not achievable with either the first or second plasma chamber alone.

Based on the foregoing, it should be understood that in one embodiment of the present invention multiple independently controlled plasma chambers are used to supply reactive constituents to a common substrate processing region, so as to provide ion-to-radical concentration ratios within the substrate processing region that are not achievable through operation of a single plasma chamber alone. Based on the discussion with regard to FIG. 1, it should be further appreciated that generation of multiple plasmas having significantly different ion-to-radical concentration ratios provides for a broader range of ion-to-radical concentration ratio within the substrate processing region when the reactive constituents of the multiple plasmas are combined. A number of semiconductor substrate processing systems are disclosed herein that provide for spatial combination of reactive constituent outputs from multiple independently controlled plasma chambers to create a combination of reactive constituents within a substrate processing region that is not achievable with a single plasma chamber alone.

Figure 2A:
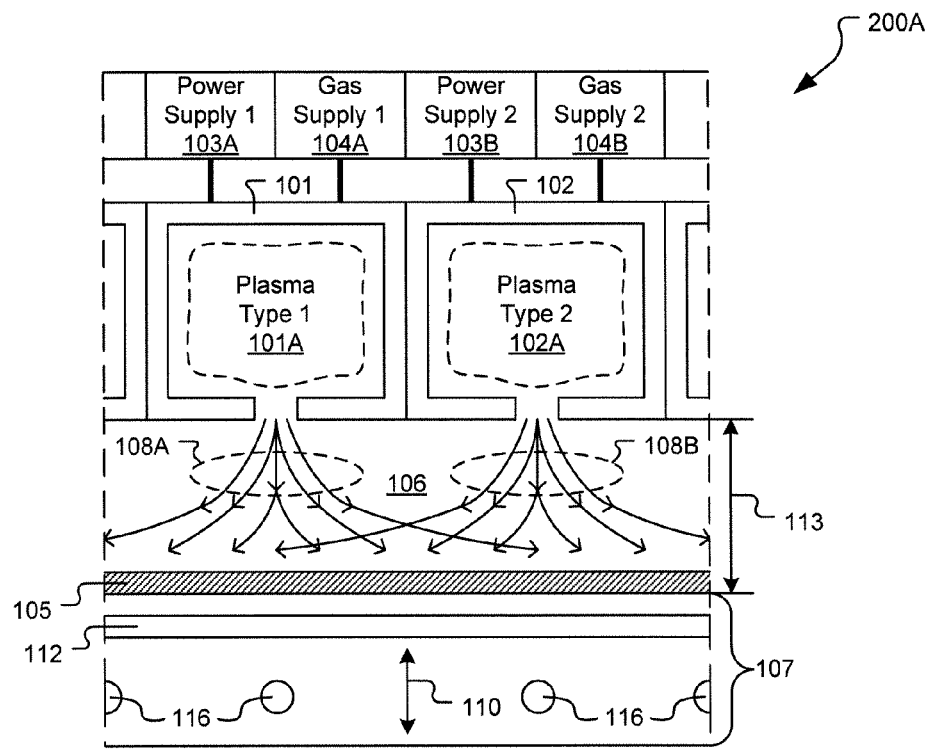
FIG. 2A shows a semiconductor substrate processing system, in accordance with one embodiment of the present invention.

FIG. 2A shows a semiconductor substrate processing system 200A, in accordance with one embodiment of the present invention. The system 200A includes a substrate support 107 defined to support a substrate 105 in exposure to a processing region 106. The system 200A also includes a first plasma chamber 101 defined to generate a first plasma 101A and supply reactive constituents 108A of the first plasma 101A to the processing region 106 through an opening in the first plasma chamber 101. The system 200A also includes a second plasma chamber 102 defined to generate a second plasma 102A and supply reactive constituents 108B of the second plasma 102A to the processing region 106 through an opening in the second plasma chamber 102. The first plasma chamber 101 and the second plasma chamber 102 are defined to be independently controlled.

More specifically, the first plasma chamber 101 is electrically connected to a first power supply 103A. The first power supply 103A is defined to supply a first power to the first plasma chamber 101. The first plasma chamber 101 is also fluidly connected to a first process gas supply 104A defined to supply a first process gas to the first plasma chamber 101. The first plasma chamber 101 is defined to apply the first power to the first process gas to generate the first plasma 101A within the first plasma chamber 101.

The second plasma chamber 102 is electrically connected to a second power supply 103B. The second power supply 103B is defined to supply a second power to the second plasma chamber 102. The second plasma chamber 102 is also fluidly connected to a second process gas supply 104B defined to supply a second process gas to the second plasma chamber 102. The second plasma chamber 102 is defined to apply the second power to the second process gas to generate the second plasma 102A within the second plasma chamber 102.

It should be understood that depending on the power applied and process gas used, the first and second plasma chambers 101/102 can generate significantly different types of plasmas 101A/102A. In one embodiment, the first and second power supplies 103A/103B are independently controllable. Also, in one embodiment, the first and second process gas supplies 104A/104B are independently controllable. And, in another embodiment, both the first and second power supplies 103A/103B and the first and second process gas supplies 104A/104B are independently controllable.

It should be understood that independent control of the first and second process gas supplies 104A/104B can be with regard to one or more of gas type/mixture, gas flow rate, gas temperature, and gas pressure, among essentially any other process gas related parameter. Also, it should be understood that independent control of the first and second power supplies 103A/103B can be with regard to one or more of radiofrequency (RF) amplitude, RF frequency, voltage level, and current level, among essentially any other power related parameter.

In one embodiment, the first power supplied by the first power supply 103A to the first plasma chamber 101 is either direct current (DC) power, RF power, or a combination of DC and RF power. Similarly, in one embodiment, the second power supplied by the second power supply 103B to the second plasma chamber 102 is either DC power, RF power, or a combination of DC and RF power. In one embodiment, the first power supplied by the first power supply 103A to the first plasma chamber 101 is RF power having a frequency of either 2 megaHertz (MHz), 27 MHz, 60 MHz, 400 kiloHertz (kHz), or a combination thereof, and the second power supplied by the second power supply 103B to the second plasma chamber 102 is RF power having a frequency of either 2 MHz, 27 MHz, 60 MHz, 400 kHz, or a combination thereof. In one version of this embodiment, the frequencies of the first and second powers are different. However, in another version of this embodiment, the frequencies of the first and second powers can be the same if the process gases supplied to the first and second plasma chambers 101/102 provide for differentiation between the first and second plasmas 101A/102A.

The type of power applied to first and second plasma chambers 101/102 is partially dependent upon the type of plasma chamber used. In some example embodiments, each of the first and second plasma chambers 101/102 is either a hollow cathode chamber, or an electron cyclotron resonance chamber, or a microwave driven chamber, or an inductively coupled chamber, or a capacitively coupled chamber. Also, in one embodiment, the first and second plasma chambers 101/102 are the same type of plasma chamber. However, in another embodiment, the first and second plasma chambers 101/102 are different types of plasma chambers.

Also, it should be understood that in different embodiments the first and second plasma chambers 101/102 can include different forms of power delivery components. The power delivery components are responsible for conveying the power to the process gas inside the first/second plasma chamber 101/102. For example, in one embodiment, the walls of the first/second plasma chamber 101/102 are electrically conductive and serve the function of the power delivery components. In this embodiment, the first and second plasma chambers 101/102 can be separated from each other by dielectric material and a conductive shield to ensure that power delivered to one plasma chamber 101/102 is not adversely received by a neighboring plasma chamber 101/102. FIG. 2E shows a variation of the system 200A in which the first and second plasma chambers 101/102 are separated by a conductive shield 151 disposed between dielectric material 150, in accordance with one embodiment of the present invention. In one embodiment, the conductive shield 151 is electrically connected to a reference ground potential.

Figure 2B:
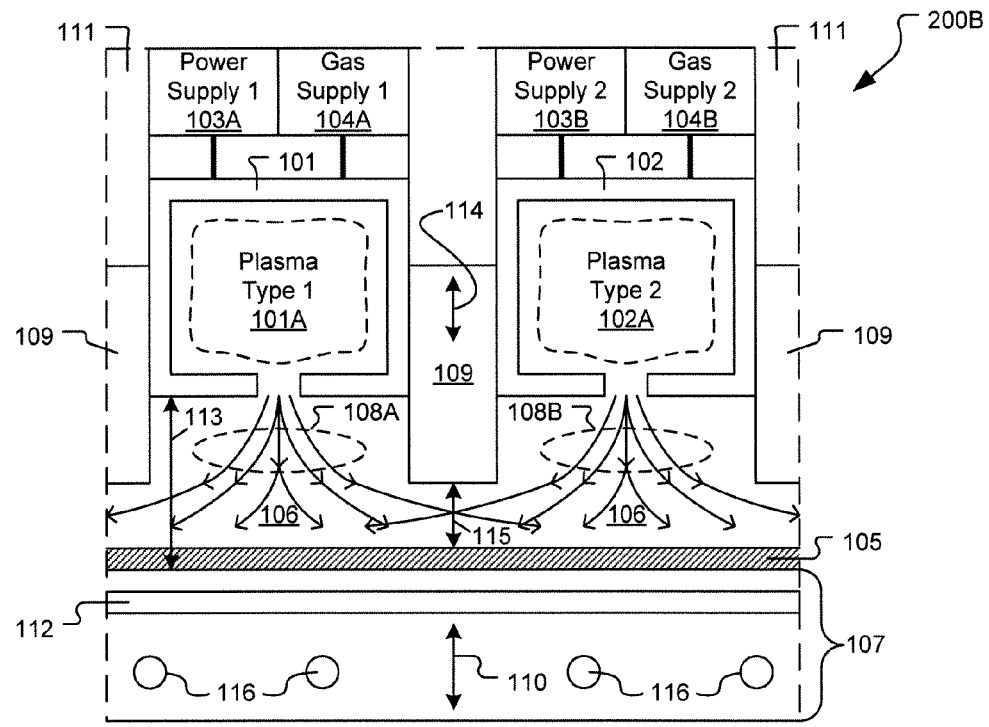
FIG. 2B shows a semiconductor substrate processing system, in accordance with one embodiment of the present invention.
Figure 2C:
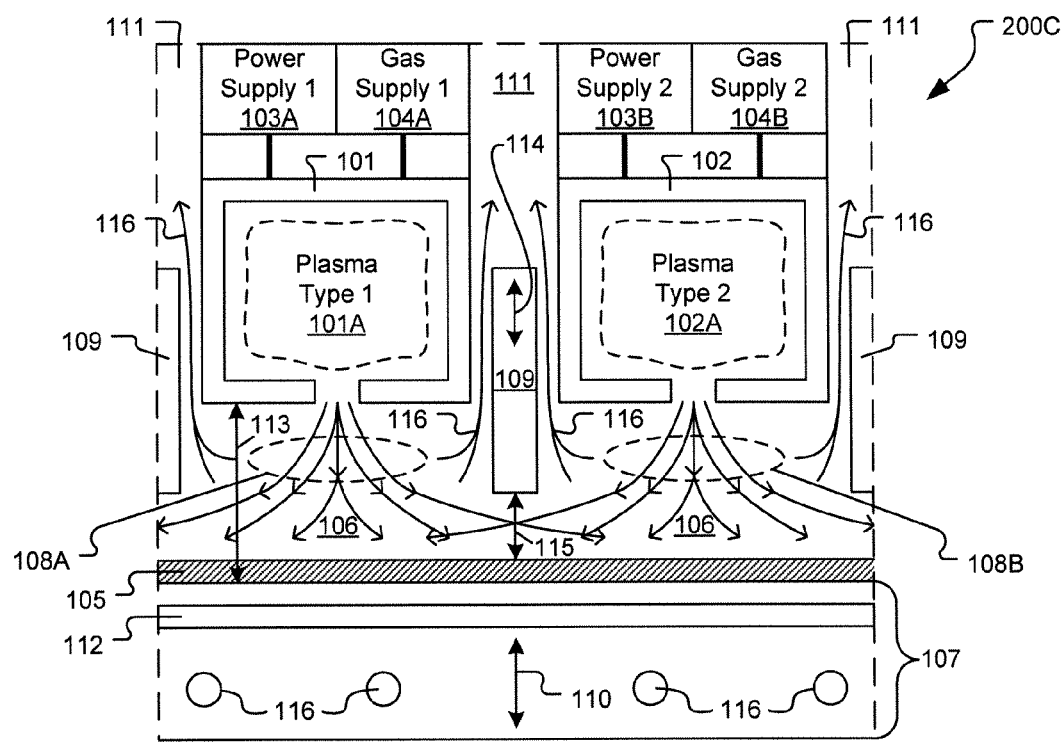
FIG. 2C shows a semiconductor substrate processing system, in accordance with one embodiment of the present invention.
Figure 2D:
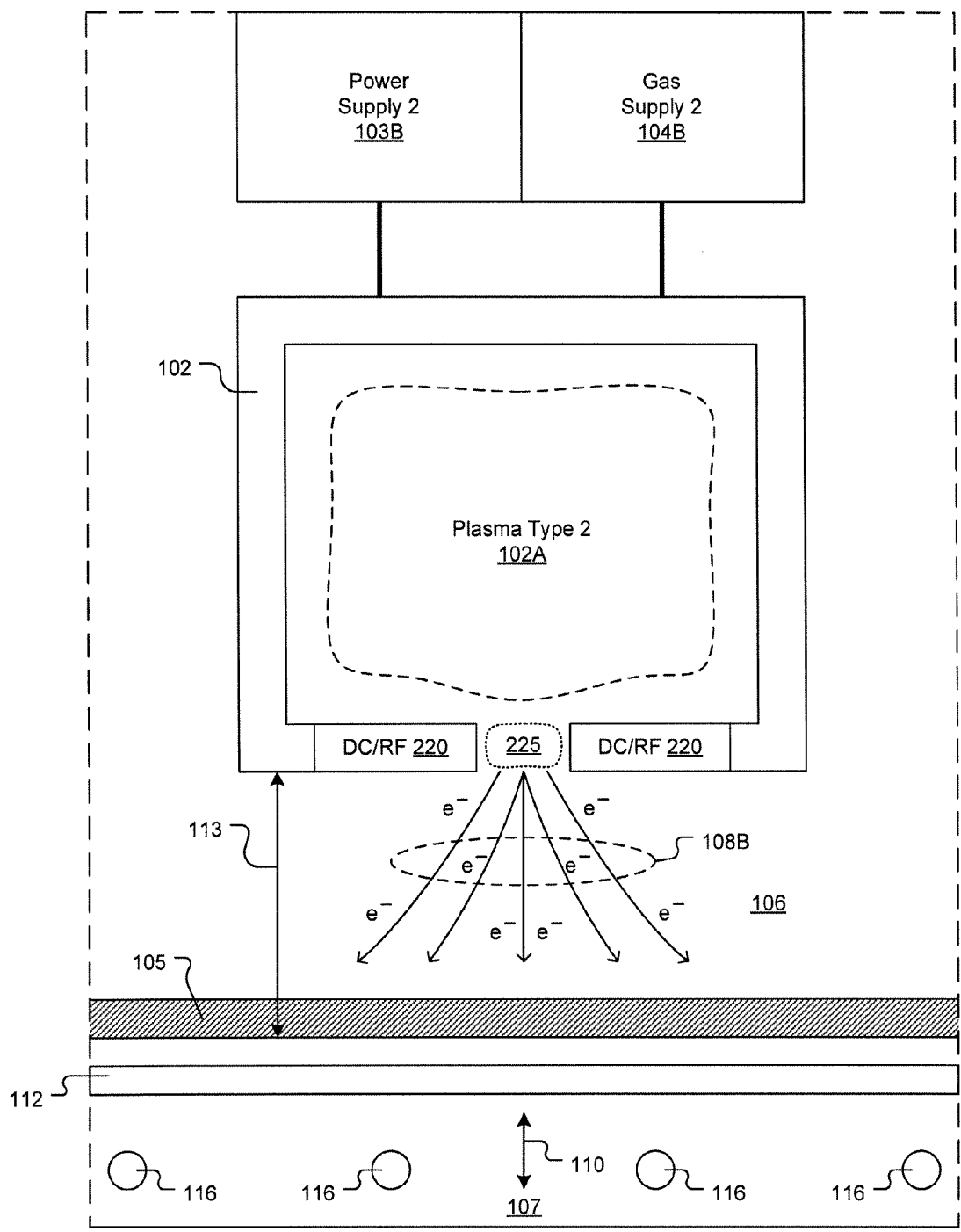
FIG. 2D shows a variation of the second plasma chamber having an energized outlet region to enhance ion extraction, in accordance with one embodiment of the present invention.
Figure 2E:
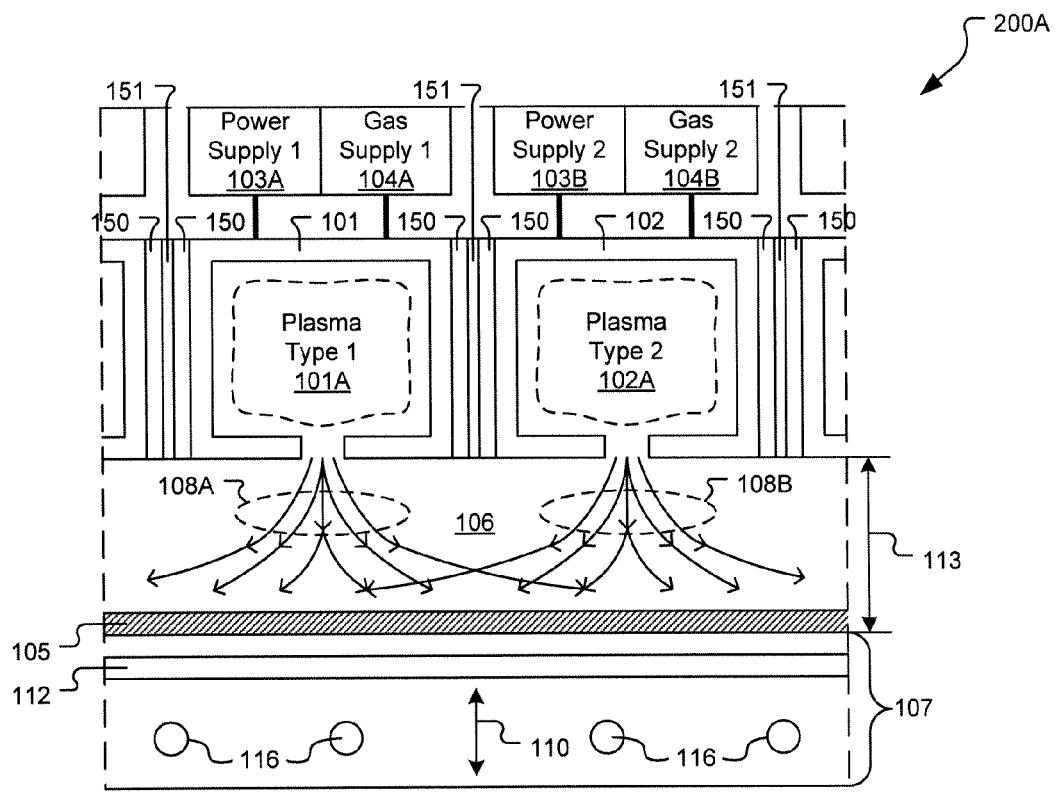
FIG. 2E shows a variation of the system in which the first and second plasma chambers are separated by a dielectric material, in accordance with one embodiment of the present invention.
Figures 1, 2F:
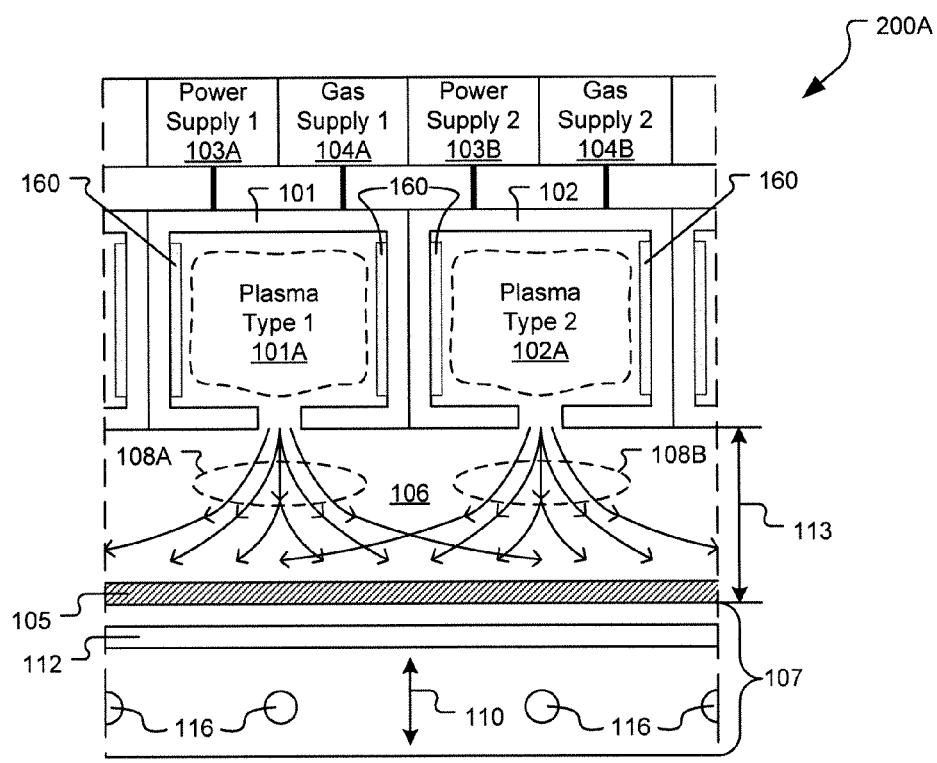
Figures 2, 2F:
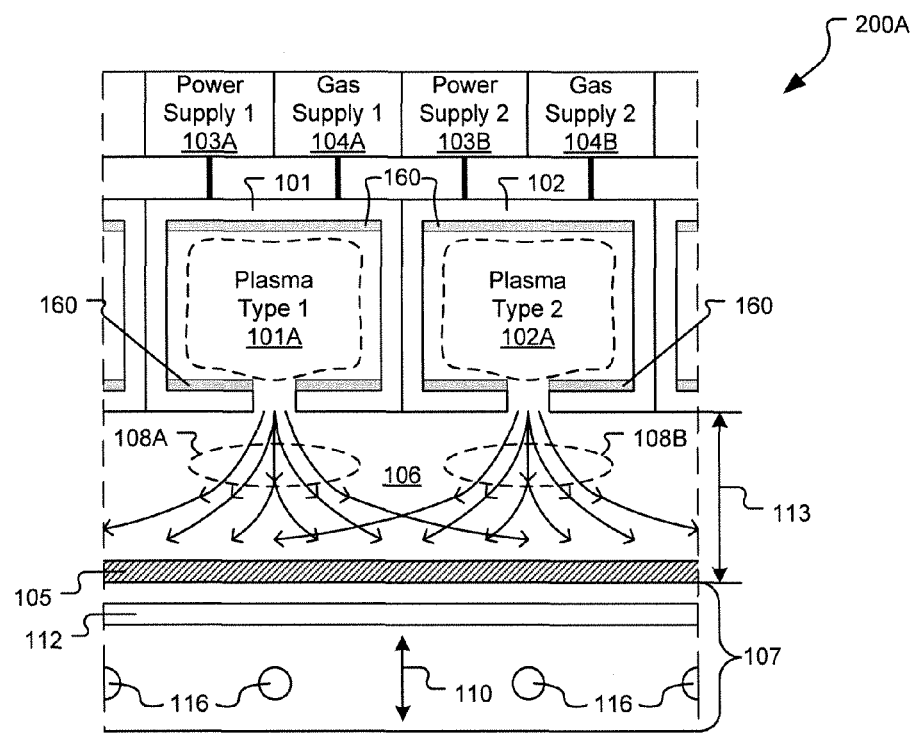

FIGS. 2F-1 and 2F-2 show another variation of the system 200A of FIG. 2A in which the power delivery components of the first and second plasma chambers 101/102 are implemented as electrodes 160 disposed within the first and second plasma chambers 101/102, in accordance with one embodiment of the present invention. FIG. 2F-1 shows an example embodiment in which the electrodes 160 are placed on sidewalls of the first and second plasma chambers 101/102. FIG. 2F-2 shows an example embodiment in which the electrodes 160 are placed on the upper and lower surfaces within the interior of the first and second plasma chambers 101/102. In this embodiment, the electrode 160 on the upper surface within the interior of the plasma chambers 101/102 includes one or more holes defined therethrough to enable fluid communication of the first and second process gas supplies 104A/104B with the interior volume of the first and second plasma chambers 101/102, respectively. Also, in this embodiment, the electrode 160 on the lower surface within the interior of the first and second plasma chambers 101/102 includes one or more holes defined therethrough to enable passage of the reactive constituents of the first and second plasmas 101A/102A, respectively, to the processing region 106. It should be understood that the placements of the electrodes 160 in FIGS. 2F-1 and 2F-2 are shown by way of example. In other embodiments, the electrodes 160 can be disposed on any one or more surfaces within the plasma generation volume of the first/second plasma chamber 101/102.

Figure 2G:
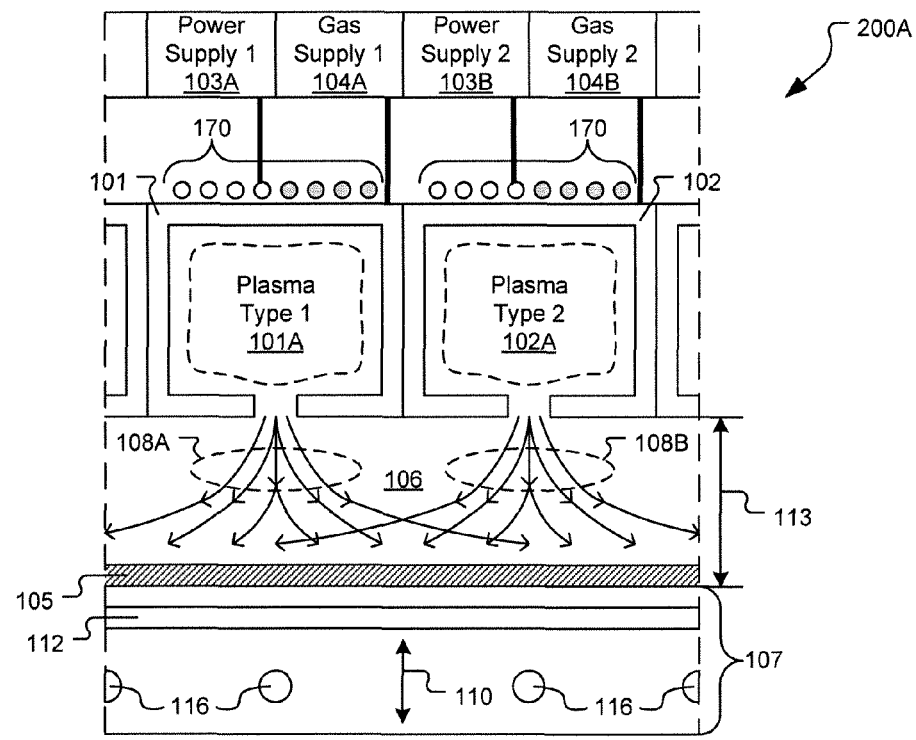
FIG. 2G shows another variation of the system of FIG. 2A in which the power delivery components of the first and second plasma chambers are implemented as coils disposed proximate to the first and second plasma chambers, in accordance with one embodiment of the present invention.

FIG. 2G shows another variation of the system 200A of FIG. 2A in which the power delivery components of the first and second plasma chambers 101/102 are implemented as coils 170 disposed proximate to the first and second plasma chambers 101/102, in accordance with one embodiment of the present invention. It should be understood that the top placement of the coils 170 in FIG. 2G is shown by way of example. In other embodiments, the coils 170 can be disposed proximate to any one or more outer surfaces of the first/second plasma chamber 101/102. It should be understood that the different power delivery component embodiments of FIGS. 2A, 2E, 2F, and 2G are shown by way of example. In other embodiments, the first and second plasma chambers 101/102 can implement power delivery components different than those exemplified in FIGS. 2A, 2E, 2F, and 2G.

Given the foregoing, it should be understood that the first and second plasma chambers 101/102 can be operated using different process gases and/or different powers in order to achieve a condition in which one plasma provides a higher concentration of ions relative to radicals, and in which the other plasma provides a higher concentration of radicals relative to ions. Also, the first and second plasma chambers 101/102 are defined to respectively distribute the reactive constituents 108A/108B of the first and second plasmas 101A/102A in a substantially uniform manner within the processing region 106 above the substrate support 107.

In one embodiment, the first and second plasma chambers 101/102 are defined to operate at internal pressures of up to about one Torr (T). Also, in one embodiment, the processing region 106 is operated within a pressure range extending from about 1 milliTorr (mT) to about 100 mT. The outlets of the first and second plasma chambers 101/102 are defined to provide and control the pressure drop between the interiors of the first and second plasma chambers 101/102 and the processing region 106. Also, if necessary, in one embodiment, the radical constituents can be supplied from either one of the first and second plasma chambers 101/102 in a cross-flow arrangement, or use cross-flow within the processing region 106, to manage etch product distribution across the substrate 105.

In one example embodiment, the system 200A is operated to provide a processing region 106 pressure of about 10 mT, with a process gas throughput flow rate of about 1000 scc/sec (standard cubic centimeters per second), and with a reactive constituent 108A/108B residence time within the processing region 106 of about 10 milliseconds (ms). It should be understood and appreciated that the above example operating conditions represent one of an essentially limitless number of operating conditions that can be achieved with the system 200A. The above example operating conditions do not represent or imply any limitation on the possible operating conditions of the system 200A.

In one embodiment, the substrate support 107 is defined to be movable in a direction 110 substantially perpendicular to a top surface of the substrate support 107 upon which the substrate 105 is to be supported, thereby enabling adjustment of a process gap distance 113. The process gap distance 113 extends perpendicularly between the top surface of the substrate support 107 and the first and second plasma chambers 101/102. In one embodiment, the substrate support 107 is movable in the direction 110 such that the process gap distance is adjustable within a range extending from about 2 cm to about 10 cm. In one embodiment, the substrate support 107 is adjusted to provide a process gap distance 113 of about 5 cm. In an alternate embodiment, adjustment of the process gap distance 113 can be achieved through movement of the first and second plasma chambers 101/102 in the direction 110 relative to the substrate support 107.

Adjustment of the process gap distance 113 provides for adjustment of a dynamic range of the ion flux emanating from either or both of the first and second plasma chambers 101/102. Specifically, the ion flux that reaches the substrate 105 can be decreased by increasing the process gap distance 113, vice versa. In one embodiment, when the process gap distance 113 is adjusted to achieve and adjustment in the ion flux at the substrate 105, the process gas flow rate through the higher radical-supplying plasma chamber (101/102) can be adjusted to provide for independent control of the radical flux at the substrate 105. Additionally, it should be appreciated that the process gap distance 113 in combination with the ion and radical fluxes emanating from the first and second plasma chambers are controlled to provide for a substantially uniform ion density and radical density at the substrate 105.

In one embodiment, the substrate support 107 includes a bias electrode 112 for generating an electric field to attract ions toward the substrate support 107, and thereby toward the substrate 105 held on the substrate support 107. Also, in one embodiment, the substrate support 107 includes a number of cooling channels 116 through which a cooling fluid can be flowed during plasma processing operations to maintain temperature control of the substrate 105. Also, in one embodiment, the substrate support 107 can include a number of lifting pins defined to lift and lower the substrate 105 relative to the substrate support 107. In one embodiment, the substrate support 107 is defined as an electrostatic chuck equipped to generate an electrostatic field for holding the substrate 105 securely on the substrate support 107 during plasma processing operations.

In various embodiments, the first and second plasma chambers 101/102 are defined to operate in either a simultaneous manner or a pulsed manner. Operation of the first and second plasma chambers 101/102 in the pulsed manner includes either the first plasma chamber 101 or the second plasma chamber 102 operating at a given time and in an alternating sequence. Specifically, the first plasma chamber 101 will operate for a first period of time with the second plasma chamber 102 idle, then the second plasma chamber 102 will operate for a second period of time with the first plasma chamber 101 idle, with the first and second plasma chambers 101/102 operating in this alternating manner for a prescribed total period of time.

Operation of the first and second plasma chambers 101/102 in the pulsed manner can serve to prevent/limit undesirable communication between the first and second plasmas 101A/102A with regard to process gas and/or power. Prevention of undesirable communication between the first and second plasma chambers 101/102 includes ensuring that process gases/species of the first plasma 101A do not enter the second plasma chamber 102, and ensuring that the process gases/species of the second plasma 102A do not enter the first plasma chamber 101. Prevention of undesirable communication between the first and second plasma chambers 101/102 also includes ensuring that power supplied to the first plasma chamber 101 does not flow to the second plasma 102A in the second plasma chamber, and ensuring that power supplied to the second chamber 102 does not flow to the first plasma 101A in the first plasma chamber 101.

In the embodiments where the first and second plasma chambers 101/102 are operated in a simultaneous manner, the first and second plasma chambers 101/102 are defined to ensure that undesirable communication therebetween is prevented/limited. For example, the respective openings of the first and second plasma chambers 101/102 in exposure to the processing region 106 are sized small enough and spaced apart far enough to avoid cross-communication between the first and second plasma chambers 101/102 with regard to process gas and/or power. Based on the foregoing, it should be understood that the first and second plasma chambers 101/102 can be independently controlled during a substrate plasma process with regard to one or more of process gas flow rate, process gas pressure, power frequency, power amplitude, on/off duration, and operational timing sequence.

FIG. 2B shows a semiconductor substrate processing system 200B, in accordance with one embodiment of the present invention. The system 200B is a variation of the system 200A of FIG. 2A. Specifically, the system 200B includes a baffle structure 109 disposed between the first and second plasma chambers 101/102 to extend from the first and second plasma chambers 101/102 toward the substrate support 107. The baffle structure 109 is defined to reduce fluid communication between the first and second plasma chambers 101/102. Also, in one embodiment, the baffle structure 109 is formed from a dielectric materials so as to reduce power communication between the first and second plasma chambers 101/102. In one embodiment, the baffle structure 109 is defined to be movable in a direction 114 substantially perpendicular to a top surface of the substrate support 107 upon which the substrate 105 is to be supported.

FIG. 2C shows a semiconductor substrate processing system 200C, in accordance with one embodiment of the present invention. The system 200C is a variation of the system 200B of FIG. 2B. Specifically, the system 200C includes an exhaust channel 111 formed between the first and second plasma chambers 101/102 to extend away from the processing region 106 in a direction substantially perpendicular to a top surface of the substrate support 107 upon which the substrate 105 is to be supported. In one embodiment, the exhaust channel 111 is open and clear to provide for exhaust of gases from the processing region 106. However, in another embodiment, the baffle structure 109 is disposed within the exhaust channel 111 between the first and second plasma chambers 101/102, so as to extend from the first and second plasma chambers 101/102 toward the substrate support 107. The baffle structure 109 disposed within the exhaust channel 111 is defined to reduce fluid communication between the first and second plasma chambers 101/102. Also, in one embodiment, the baffle structure 109 disposed within the exhaust channel 111 is formed from a dielectric material so as to reduce power communication between the first and second plasma chambers 101/102. Also, the baffle structure 109 is sized smaller than the exhaust channel 111 so as to provide for exhaust flow 116 through the exhaust channel 111 around the baffle structure 109.

In the example embodiments of FIGS. 2B and 2C, the baffle structure 109 can be used to limit fluid and/or power communication between adjacent plasma chambers, e.g., 101, 102. Additionally, the baffle structure 109 can be used to assist with establishing uniformity of ions and radicals across the substrate 105. As mentioned with regard to FIGS. 2B and 2C, the baffle structure 109 is movable in the direction 114 substantially perpendicular to the substrate support 107. This movement of the baffle structure 109 in the direction 114 enables adjustment of a distance 115 as measured perpendicularly between the baffle structure 109 and the substrate 105.

In various embodiments, the distance 115 between the baffle structure and the substrate 105 can be up to 5 cm. It should be understood, however, that the distance 115 is a function of other parameters such as process gas flow rates and ion and radical fluxes emanating from the first and second plasma chambers 101/102. In one example embodiment, the distance 115 between the baffle structure and the substrate 105 is about 2 cm. Additionally, although the baffle structure 109 as shown in the example embodiments of FIGS. 2B and 2D is rectangular shaped in cross-section, it should be understood that the baffle structure 109 can be shaped in other ways, e.g., rounded bottom, angled bottom, tapered top, etc, so as to achieve particular effects within the processing region 106, such as controlling process gas flow conditions including cross-flow and turbulence, among others.

In some situations, radical generation within a plasma in unavoidable when attempting to generate primarily ions within the plasma. In these situation, radical constituent transport from a generated plasma is also somewhat unavoidable when the primary objective is to achieve ion constituent transport from the plasma. Furthermore, extracting ions from a plasma infers that the opening between the ion source, i.e., the plasma, and the processing region, e.g., processing region 106, be large enough that a sheath does not inhibit plasma extraction and that collisions with the extracting medium walls are low so as not to neutralize the ions. In one embodiment of the present invention, an ion source region can be defined in the opening between the ion source and the processing region. This ion source region can be implemented as an energized outlet region to provide supplemental electron generation to enhance ion extraction from the ion source. For example, in one embodiment, the outlet region of the plasma chamber that is in exposure to the processing region can be defined as a hollow cathode to enhance ion generation within the outlet region itself and correspondingly enhance ion extraction from the plasma chamber.

FIG. 2D shows a variation of the second plasma chamber 102A having an energized outlet region 225 to enhance ion extraction, in accordance with one embodiment of the present invention. It should be understood, however, that one or both of the first and second plasma chambers 101/102 can be defined to have the energizable plasma outlet region 225 defined to provide supplemental electron generation to increase ion extraction. In one embodiment, the energizable plasma outlet region 225 is defined as hollow cathode. In one version of this embodiment, the outlet region 225 is circumscribed by an electrode 220 that can be power by either DC power, RF power, or a combination thereof. As the reactive constituents from the plasma 102A flow through the energizable plasma outlet region 225, the power emanating from the electrode 220 will liberate fast electrons within the outlet region 225, which will in turn cause further ionization in the process gases flowing through the outlet region 225, thereby enhancing ion extraction from the plasma chamber 102. Additionally, the bias applied across the processing region 106 by the bias electrode 112 will serve to draw ions from both the plasma 102A within the chamber 102 and from the outlet region 225 toward the substrate 105.

Figure 3A:
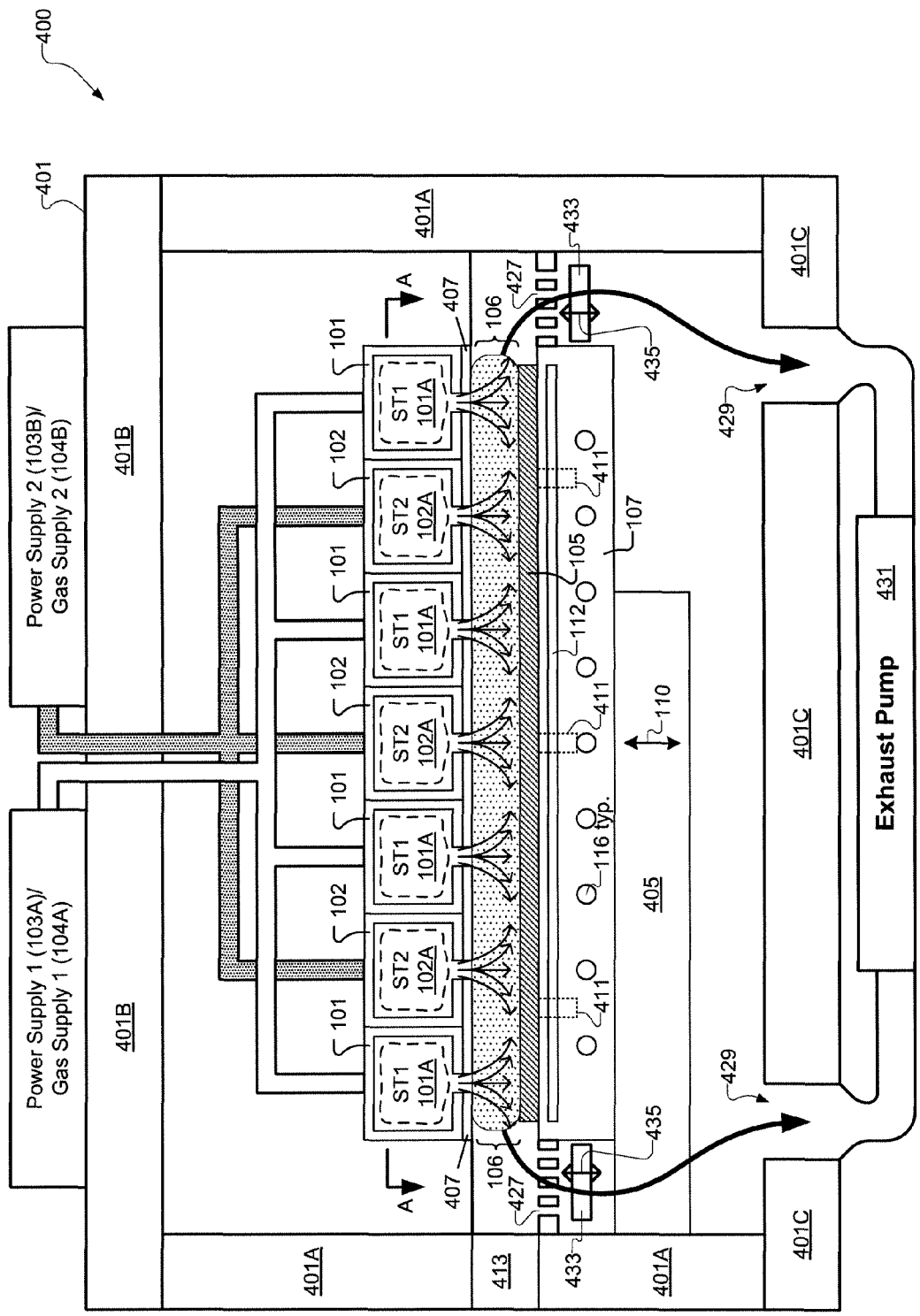
FIG. 3A shows a vertical cross-section of a semiconductor substrate processing system, in accordance with one embodiment of the present invention.

FIG. 3A shows a vertical cross-section of a semiconductor substrate processing system 400, in accordance with one embodiment of the present invention. The system 400 includes a chamber 401 formed by a top structure 401B, a bottom structure 401C, and sidewalls 401A extending between the top structure 401B and bottom structure 401C. The chamber 401 encloses the processing region 106. In various embodiments, the chamber sidewalls 401A, top structure 401B, and bottom structure 401C can be formed from different materials, such as stainless steel or aluminum, by way of example, so long as the chamber 401 materials are structurally capable of withstanding pressure differentials and temperatures to which they will be exposed during plasma processing, and are chemically compatible with the plasma processing environment.

The system 400 also includes the substrate support 107 disposed within the chamber 401 and defined to support the substrate 105 in exposure to the processing region 106. The substrate support 107 is defined to hold the substrate 105 thereon during performance of a plasma processing operation on the substrate 105. In the example embodiment of FIG. 3A, the substrate support 107 is held by a cantilevered arm 405 affixed to a wall 401A of the chamber 401. However, in other embodiments, the substrate support 107 can be affixed to the bottom plate 401C of the chamber 401 or to another member disposed within the chamber 401. In various embodiments, the substrate support 107 can be formed from different materials, such as stainless steel, aluminum, or ceramic, by way of example, so long as the substrate support 107 material is structurally capable of withstanding pressure differentials and temperatures to which it will be exposed during plasma processing, and is chemically compatible with the plasma processing environment.

In one embodiment, the substrate support 107 includes the bias electrode 112 for generating an electric field to attract ions toward the substrate support 107, and thereby toward the substrate 105 held on the substrate support 107. Also, in one embodiment, the substrate support 107 includes the number of cooling channels 116 through which a cooling fluid can be flowed during plasma processing operations to maintain temperature control of the substrate 105. Also, in one embodiment, the substrate support 107 can include a number of lifting pins 411 defined to lift and lower the substrate 105 relative to the substrate support 107. In one embodiment, a door assembly 413 is disposed within the chamber wall 401A to enable insertion and removal of the substrate 105 into/from the chamber 401. Additionally, in one embodiment, the substrate support 107 is defined as an electrostatic chuck equipped to generate an electrostatic field for holding the substrate 105 securely on the substrate support 107 during plasma processing operations.

The system 400 further includes a top plate assembly 407 disposed within the chamber 401 above and spaced apart from the substrate support 107, so as to be positioned above and spaced apart from the substrate 105 when positioned on the substrate support 107. The substrate processing region 106 exists between the top plate assembly 407 and the substrate support 107, so as to exist over the substrate 105 when positioned on the substrate support 107. As previously mentioned, in one embodiment, the substrate support 107 is movable in the direction 110 such that the process gap distance, as measured perpendicularly across the processing region 106 between the top plate assembly 407 and substrate support 107 is adjustable within a range extending from about 2 cm to about 10 cm. Also, in one embodiment, a vertical position of the substrate support 107 relative to the top plate assembly 407, vice-versa, is adjustable either during performance of the plasma processing operation or between plasma processing operations.

The top plate assembly 407 has a lower surface exposed to the processing region 106 and opposite the top surface of the substrate support 107. The top plate assembly 407 includes a first plurality of plasma ports connected to supply reactive constituents of the first plasma 101A to the processing region 106. More specifically, in the embodiment of FIG. 3A, a first plurality of plasma microchambers 101 are disposed across the top surface of the top plate assembly 407, and the first plurality of plasma ports are in fluid communication with respective openings of the first plurality of plasma microchambers 101. Thus, the first plurality of plasma ports serve to place the openings of the first plurality of plasma microchambers 101 in fluid communication with the processing region 106. It should be understood that each of the first plurality of plasma microchambers corresponds to the first plasma chamber 101, as previously discussed with regard to FIGS. 1 through 2G.

The top plate assembly 407 also includes a second plurality of plasma ports connected to supply reactive constituents of the second plasma 102A to the processing region 106. More specifically, in the embodiment of FIG. 3A, a second plurality of plasma microchambers 102 are disposed across the top surface of the top plate assembly 407, and the second plurality of plasma ports are in fluid communication with respective openings of the second plurality of plasma microchambers 102. Thus, the second plurality of plasma ports serve to place the openings of the second plurality of plasma microchambers 102 in fluid communication with the processing region 106. It should be understood that each of the second plurality of plasma microchambers corresponds to the second plasma chamber 102, as previously discussed with regard to FIGS. 1 through 2G.

Each of the first plurality of plasma microchambers 101 is defined to generate the first plasma 101A and supply reactive constituents 108A of the first plasma 101A to one or more of the first plurality of plasma ports defined along the lower surface of the top plate assembly 407. Similarly, each of the second plurality of plasma microchambers 102 is defined to generate the second plasma 102A and supply reactive constituents 108B of the second plasma 102A to one or more of the second plurality of plasma ports defined along the lower surface of the top plate assembly 407.

Figure 3B:
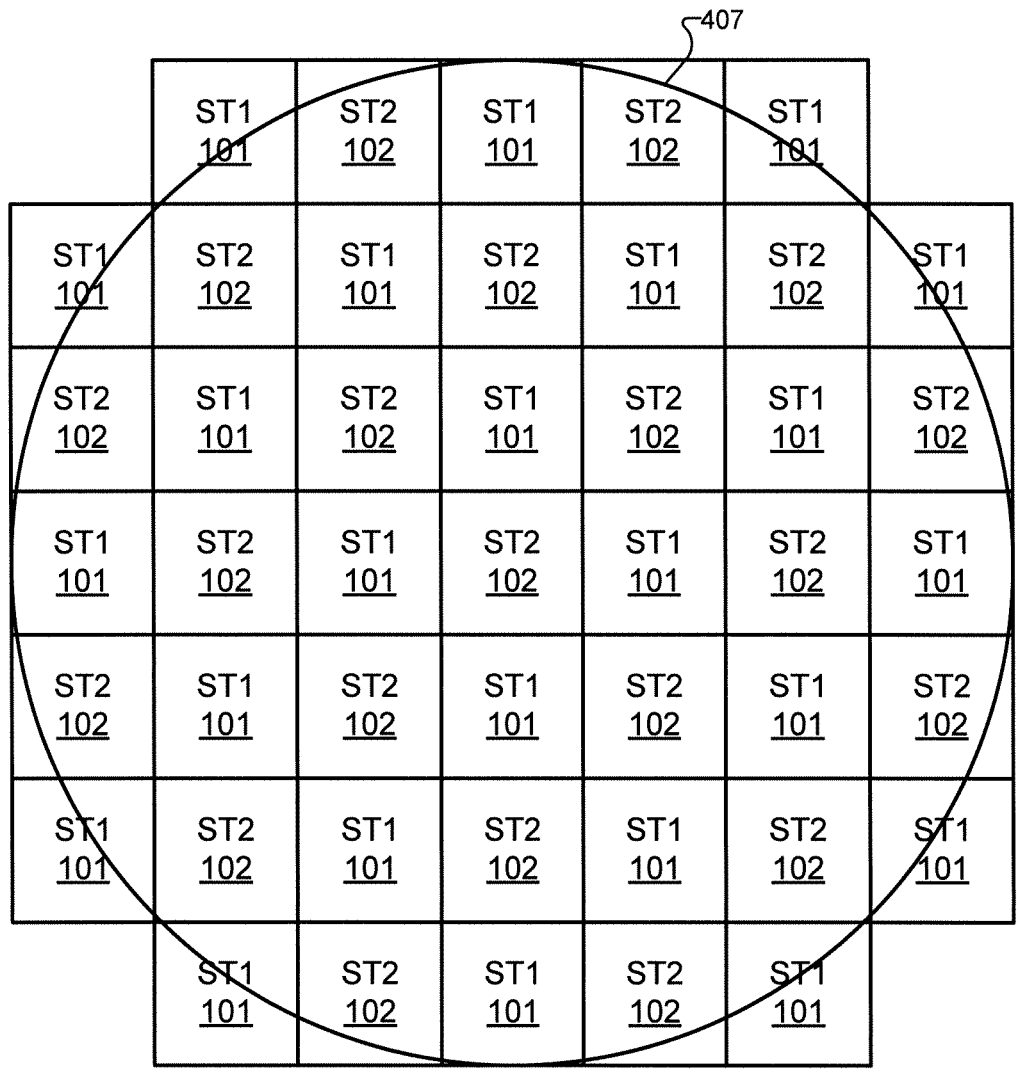
FIG. 3B shows a horizontal cross-section view A-A as referenced in FIG. 3A, in accordance with one embodiment of the present invention.

FIG. 3B shows a horizontal cross-section view A-A as referenced in FIG. 3A, in accordance with one embodiment of the present invention. As shown in FIG. 3B, the first and second plasma microchambers 101/102 are interspersed among each other across the top plate assembly 407, such that the first plurality of plasma ports are interspersed among the second plurality of plasma ports in a substantially uniform manner across the lower surface of the top plate assembly 407. In one example embodiment, the first and second plasma microchambers 101/102 are defined to have an internal diameter within a range extending from about 1 cm to about 2 cm. Also, in one example embodiment, a total number of the first and second plasma microchambers 101/102 is about 100. In yet another example embodiment, a total number of the first and second plasma microchambers 101/102 is within a range extending from about 40 to about 60, and a total number of the first and second plasma ports across the lower surface of the top plate assembly 407 is about 100.

Figure 3C:
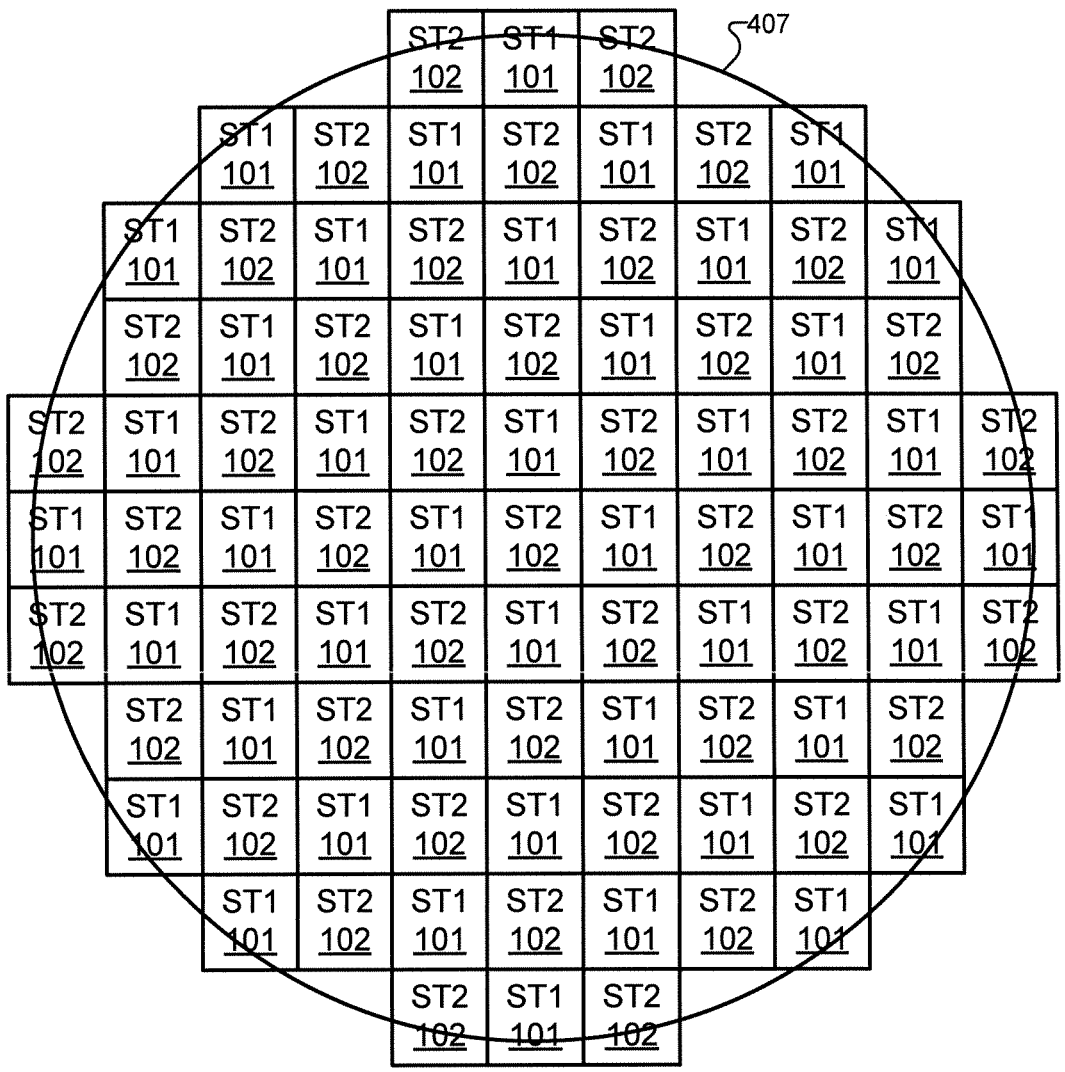
FIG. 3C shows a variation of the horizontal cross-section view of FIG. 3B in which the spacing between the first and second plasma microchambers across the top plate assembly is decreased, in accordance with one embodiment of the present invention.
Figure 3D:
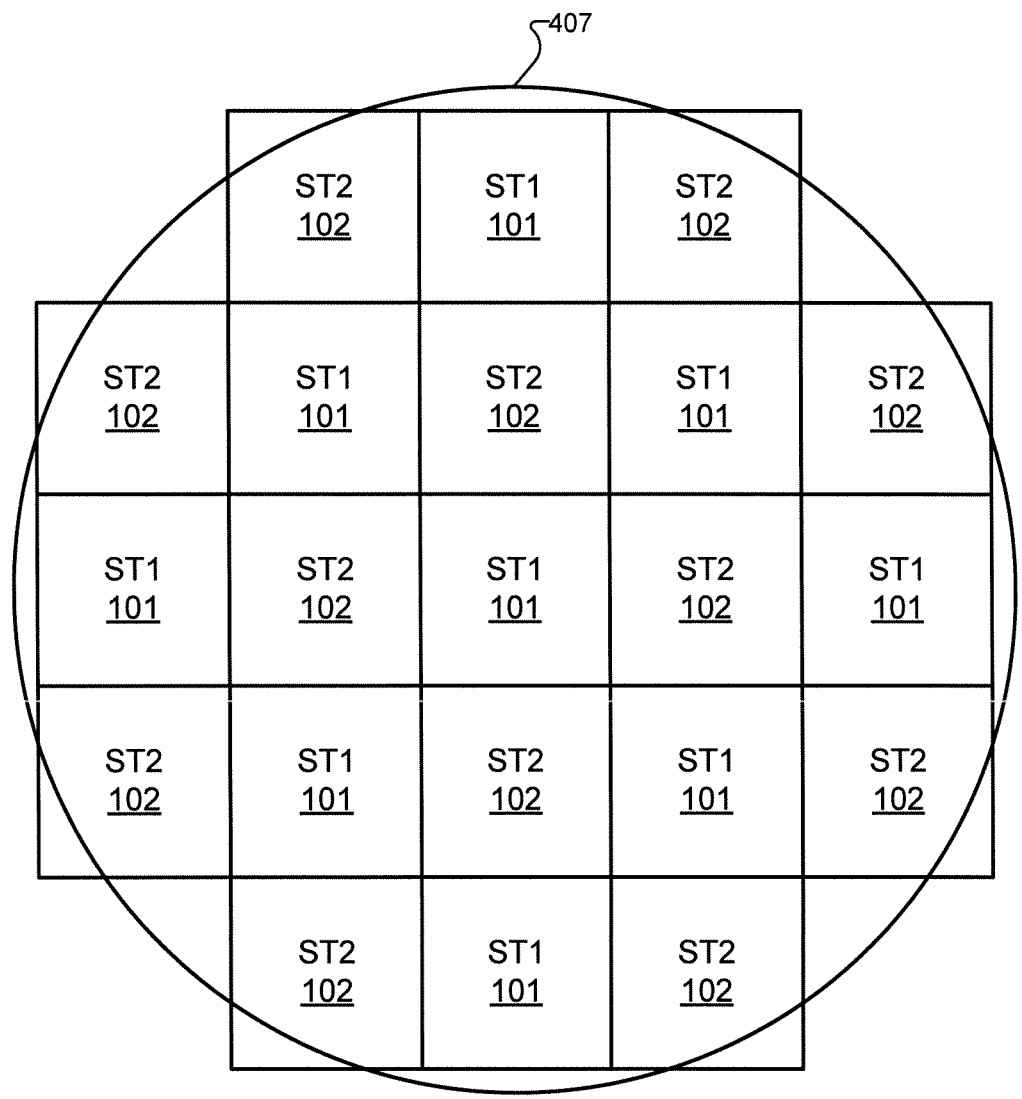
FIG. 3D shows a variation of the horizontal cross-section view of FIG. 3B in which the spacing between the first and second plasma microchambers across the top plate assembly is increased, in accordance with one embodiment of the present invention.
Figure 3E:
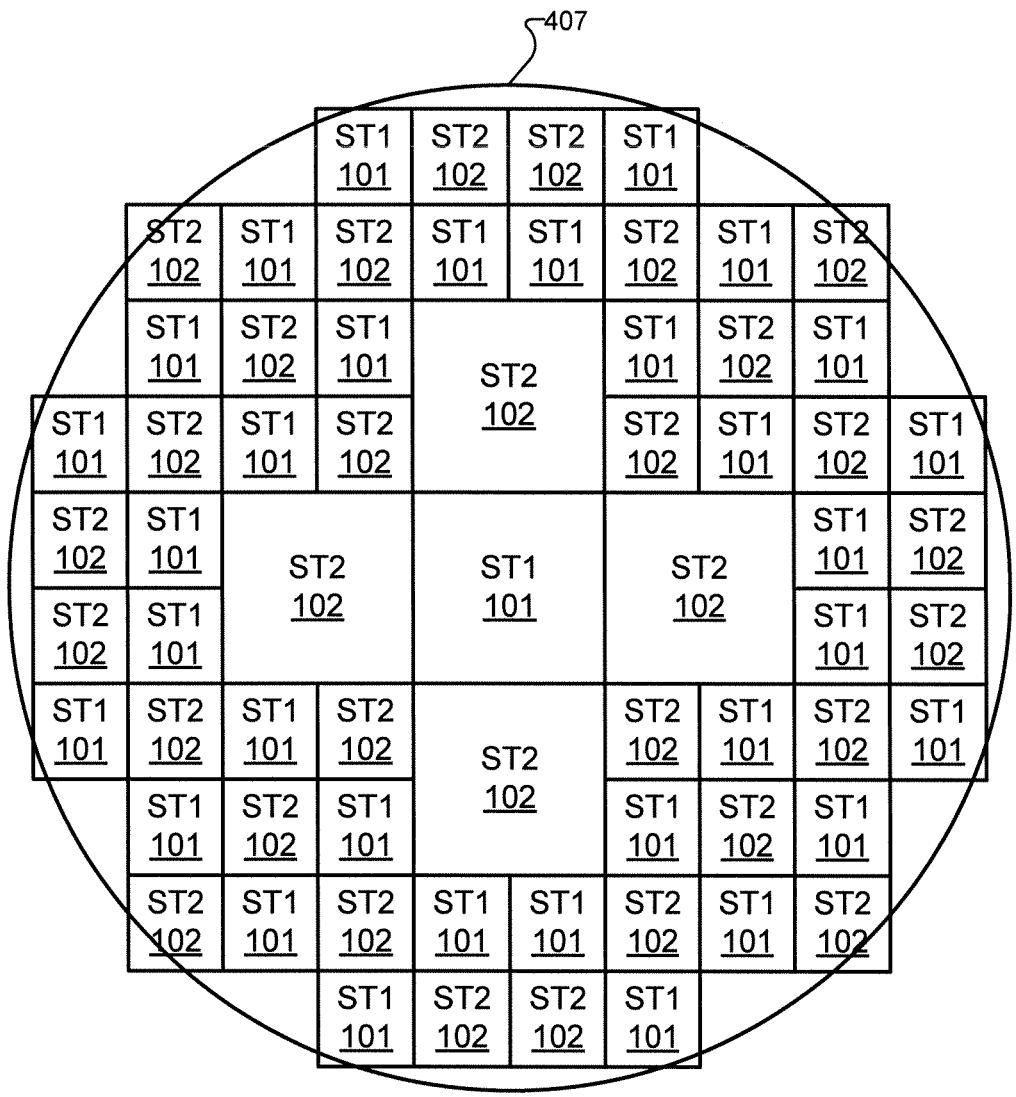
FIG. 3E shows a variation of the horizontal cross-section view of FIG. 3B in which the spacing between the first and second plasma microchambers across the top plate assembly is non-uniform, in accordance with one embodiment of the present invention.

It should be appreciated that the spacing between the first and second plasma microchambers 101/102 across the top plate assembly 407 can be varied among different embodiments. FIG. 3C shows a variation of the horizontal cross-section view of FIG. 3B in which the spacing between the first and second plasma microchambers 101/102 across the top plate assembly 407 is decreased, in accordance with one embodiment of the present invention. FIG. 3D shows a variation of the horizontal cross-section view of FIG. 3B in which the spacing between the first and second plasma microchambers 101/102 across the top plate assembly 407 is increased, in accordance with one embodiment of the present invention. FIG. 3E shows a variation of the horizontal cross-section view of FIG. 3B in which the spacing between the first and second plasma microchambers 101/102 across the top plate assembly 407 is non-uniform, in accordance with one embodiment of the present invention.

It should be understood that the above-mentioned example embodiments for the number of first and second plasma microchambers 101/102 and/or the number of plasma ports in the lower surface of the top plate assembly 407, are provided to facilitate description of the present invention and do not represent limitations of the present invention in any way. In other embodiments, essentially any configuration/number of first and second plasma microchambers 101/102 and/or plasma ports in the lower surface of the top plate assembly 407 can be defined and arranged, as necessary, to provide an appropriate mixture of radical and ion constituents within the processing region 106, so as to achieve a desired plasma processing result on the substrate 105.

The first and second plasma microchambers 101/102 are defined to operate in either a simultaneous manner or a pulsed manner Operation of the first and second plasma microchambers 101/102 in the pulsed manner includes either the first plurality of plasma microchambers 101 or the second plurality of plasma microchambers 102 operating at a given time and in an alternating sequence. In one embodiment, each of the first plurality of plasma microchambers 101 is either a hollow cathode chamber, or an electron cyclotron resonance chamber, or a microwave driven chamber, or an inductively coupled chamber, or a capacitively coupled chamber. Also, in one embodiment, each of the second plurality of plasma microchambers 102 is either a hollow cathode chamber, or an electron cyclotron resonance chamber, or a microwave driven chamber, or an inductively coupled chamber, or a capacitively coupled chamber.

In one example embodiment, the plasma microchambers (101 or 102) that are primarily responsible for radical constituent supply to the processing region 106 are defined as microwave driven plasma microchambers. Also, in one example embodiment, the plasma microchambers (101 or 102) that are primarily responsible for ion constituent supply to the processing region 106 are defined as either hollow cathode plasma microchambers, electron cyclotron resonance plasma microchambers, capacitively coupled plasma microchambers, or a type of resonant discharge plasma microchamber. In one particular example embodiment, each of the first plurality of plasma microchambers 101 is defined as an inductively coupled plasma microchamber 101 that is primarily responsible for supplying radical constituents to the processing region 106. Also, in this particular example embodiment, each of the second plurality of plasma microchambers 102 is defined as a capacitively coupled plasma microchamber 102 that is primarily responsible for supplying ion constituents to the processing region 106.

It should be understood that the above-mentioned example embodiments for the types of first and second plasma microchambers 101/102 are provided to facilitate description of the present invention and do not represent limitations of the present invention in any way. In other embodiments, the first and second plasma microchambers 101/102 can be respectively defined as essentially any type of plasma microchamber, or combination of types of plasma microchambers, so long as the first and second plasma microchambers 101/102 are defined to supply the type(s) of reactive constituent(s) to the processing region 106 that they are primarily responsible for supplying, so as to achieve a desired plasma processing result on the substrate 105.

The system 400 further includes a first power supply 103A defined to supply a first power to the first plurality of plasma microchambers 101. The system 400 also includes a first process gas supply 104A defined to supply a first process gas to the first plurality of plasma microchambers 101. The system 400 also includes a second power supply 103B defined to supply a second power to the second plurality of plasma microchambers 102. The system 400 also includes a second process gas supply 104B defined to supply a second process gas to the second plurality of plasma microchambers 102. In one embodiment, the first and second power supplies 103A/103B are independently controllable. In one embodiment, the first and second process gas supplies 104A/104B are independently controllable. In one embodiment, both the first and second power supplies 103A/103B, and the first and second process gas supplies 104A/104B are independently controllable. In one embodiment, the first power that is supplied to the first plurality of plasma microchambers 101 is either DC power, RF power, or a combination of DC and RF power. Also, in one embodiment, the second power that is supplied to the second plurality of plasma microchambers 102 is either DC power, RF power, or a combination of DC and RF power.

With regard to supply of RF power by either of the first and second power supplies 103A/103B, it should be understood that the supplied RF power can be independently controllable with regard to RF power frequency and/or amplitude. Also, it should be understood that each of the first and second power supplies 103A/103B includes respective matching circuitry through which its RF power is transmitted to ensure efficient RF power transmission to the first and second pluralities of plasma microchambers 101/102, respectively. In one embodiment, the first power supplied by the first power supply 103A to each of the first plurality of plasma microchambers 101 is RF power having a frequency of either 2 MHz, 27 MHz, 60 MHz, or 400 kHz, and the second power supplied by the second power supply 103B to each of the second plurality of plasma microchambers 102 is RF power having a frequency of either 2 MHz, 27 MHz, 60 MHz, or 400 kHz. In this embodiment, the first and second powers have at least one different frequency.

During operation of the system 400, the process gases supplied by the first and second process gas supplies 104A/104B are transformed into the first and second plasmas 101A/102A, respectively, within each of the first and second pluralities of plasma microchambers 101/102. Reactive species within the first and second plasmas 101A/102A move from the first and second pluralities of plasma microchambers 101/102 to the substrate processing region 106 over the substrate support 107, i.e., onto the substrate 105 when disposed on the substrate support 107.

In one embodiment, upon entering the substrate processing region 106 from the first and second pluralities of plasma microchambers 101/102, the used process gas flows through peripheral vents 427, and is pumped out through exhaust ports 429 by an exhaust pump 431. In one embodiment, a flow throttling device 433 is provided to control a flow rate of the used process gas from the substrate processing region 106. In one embodiment, the flow throttling device 433 is defined as a ring structure that is movable toward and away from the peripheral vents 427, as indicated by arrows 435.

It should be appreciated that the system 400 utilizes a large number of small plasma sources of one type, i.e., the first plurality of plasma microchambers 101, interspersed among a large number of small plasma sources of another type, i.e., the second plurality of plasma microchambers 102, in order to deliver a combined reactive constituent flux from each type of plasma source in a substantially uniform manner to the substrate 105. In one embodiment, one type of plasma source generates a larger density of radical constituents relative to ion constituents, and the other type of plasma source generates a larger density of ion constituents relative to radical constituents, thereby providing independent control of ion and radical concentrations within the processing region 106.

Figure 4A:
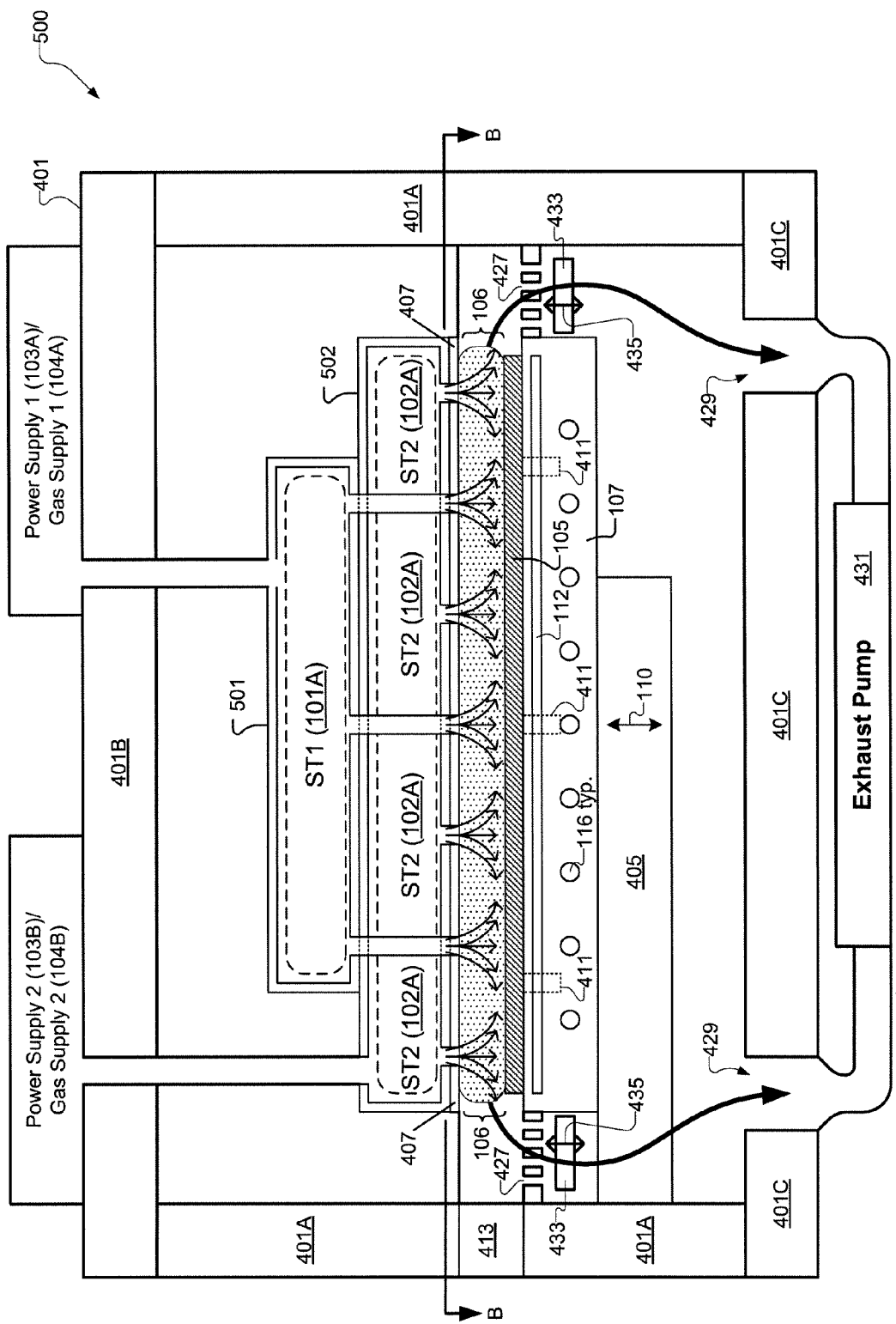
FIG. 4A shows another system for substrate plasma processing, in accordance with one embodiment of the present invention.

FIG. 4A shows another system 500 for substrate plasma processing, in accordance with one embodiment of the present invention. The system 500 is essentially equivalent to the system 400 of FIG. 3A with regard to the chamber 401, the substrate support 107, the peripheral vents 427, the flow throttling device 433, the exhaust ports 429, and the exhaust pump 431. However, the system 500 includes a variation on the first and second pluralities of plasma microchambers 101/102 disposed across the top plate assembly 407A, as previously discussed with regard to FIG. 3A. Specifically, rather than including many instances of the first and second plasma microchambers 101/102 to supply their respective reactive constituents to the plasma ports in the top plate assembly 407, the system 500 includes a large first plasma chamber 501 defined to generate the first plasma 101A and supply reactive constituents of the first plasma 101A to each of a first plurality of plasma ports within the top plate assembly 407. Similarly, the system 500 includes a large second plasma chamber 502 defined to generate the second plasma 102A and supply reactive constituents of the second plasma 102A to each of a second plurality of plasma ports within the top plate assembly 407.

In one embodiment, the system 500 includes a single instance of the first plasma chamber 501 to supply reactive constituents of the first plasma 101A to the processing region 106. Also, in this embodiment, the system 500 includes a single instance of the second plasma chamber 501 to supply reactive constituents of the second plasma 102A to the processing region 106. In other embodiments, the system 500 can include more than one instance of the first plasma chamber 501 to supply reactive constituents of the first plasma 101A to the processing region 106, wherein each instance of the first plasma chamber 501 is fluidly connected to multiple plasma ports within the top plate assembly 407. Similarly, in other embodiments, the system 500 can include more than one instance of the second plasma chamber 502 to supply reactive constituents of the second plasma 102A to the processing region 106, wherein each instance of the second plasma chamber 502 is fluidly connected to multiple plasma ports within the top plate assembly 407.

Also, it should be understood that the characteristics and operational conditions previously discussed with regard to the first plasma chamber 101 of FIGS. 2A-2D are equally applicable to the first plasma chamber 501. Also, it should be understood that the characteristics and operational conditions previously discussed with regard to the second plasma chamber 102 of FIGS. 2A-2D are equally applicable to the second plasma chamber 502.

Figure 4B:
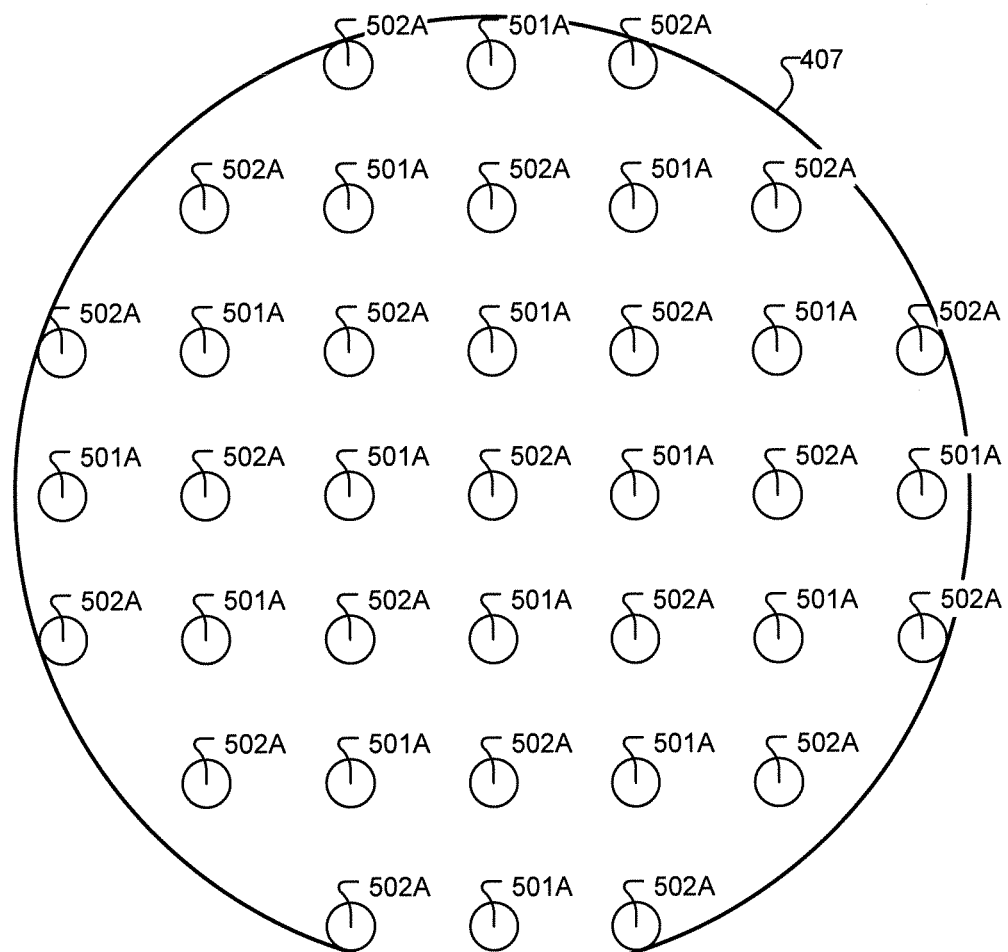
FIG. 4B shows a horizontal cross-section view B-B as referenced in FIG. 4A, in accordance with one embodiment of the present invention.

The plasma ports within the top plate assembly 407 that are fluidly connected to the first plasma chamber 501 are interspersed across the top plate assembly 407 in a substantially uniform manner with the plasma ports within the top plate assembly 407 that are fluidly connected to the second plasma chamber 502. FIG. 4B shows a horizontal cross-section view B-B as referenced in FIG. 4A, in accordance with one embodiment of the present invention. As shown in FIG. 4B, the outputs of the first and second plasma chambers 501/502 are interspersed among each other across the top plate assembly 407 in a substantially uniform manner.

Figure 4C:
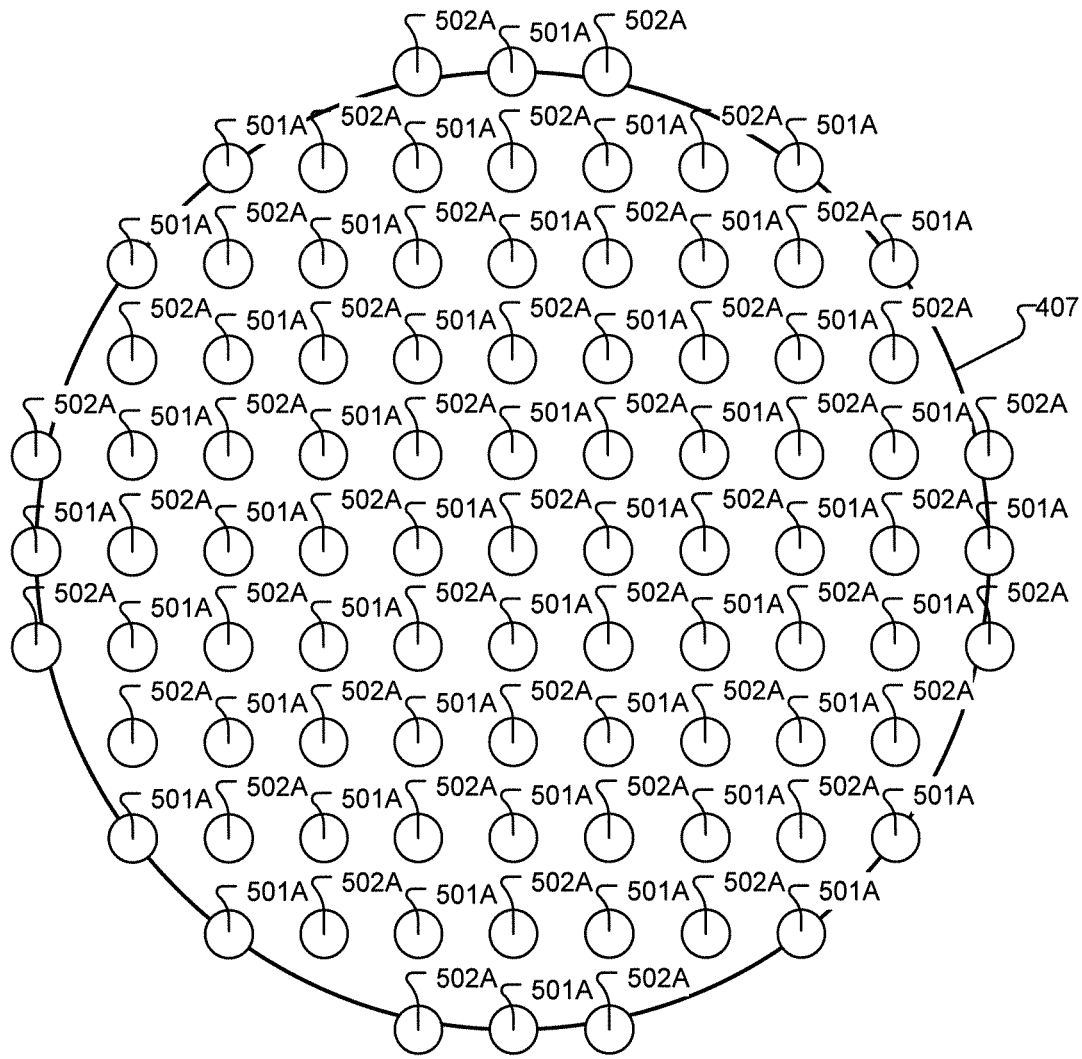
FIG. 4C shows a variation of the horizontal cross-section view of FIG. 4B in which the spacing between the plasma ports associated with the first and second plasma chambers across the top plate assembly is decreased, in accordance with one embodiment of the present invention.
Figure 4D:
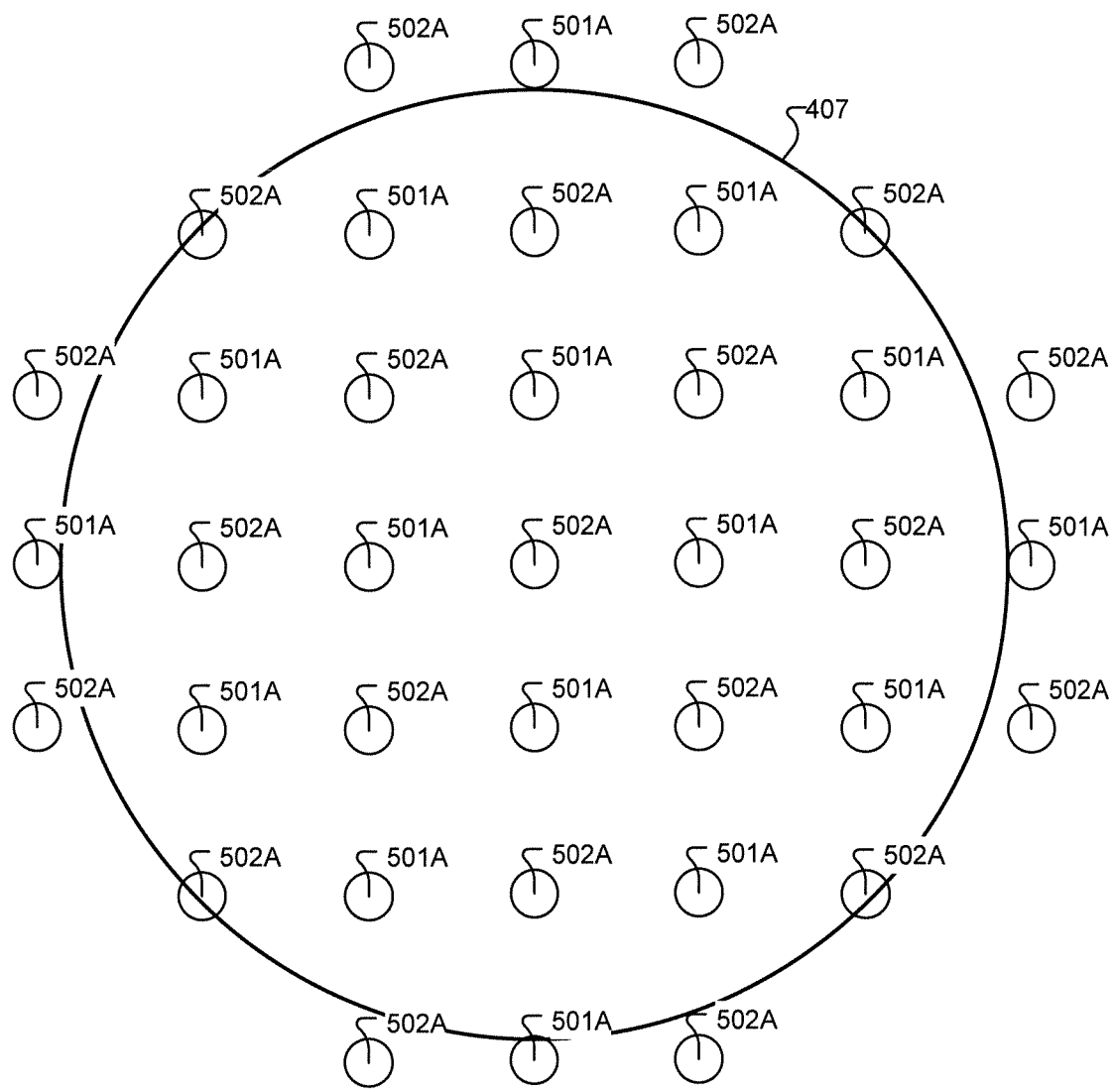
FIG. 4D shows a variation of the horizontal cross-section view of FIG. 4B in which the spacing between the plasma ports associated with the first and second plasma chambers across the top plate assembly is increased, in accordance with one embodiment of the present invention.
Figure 4E:
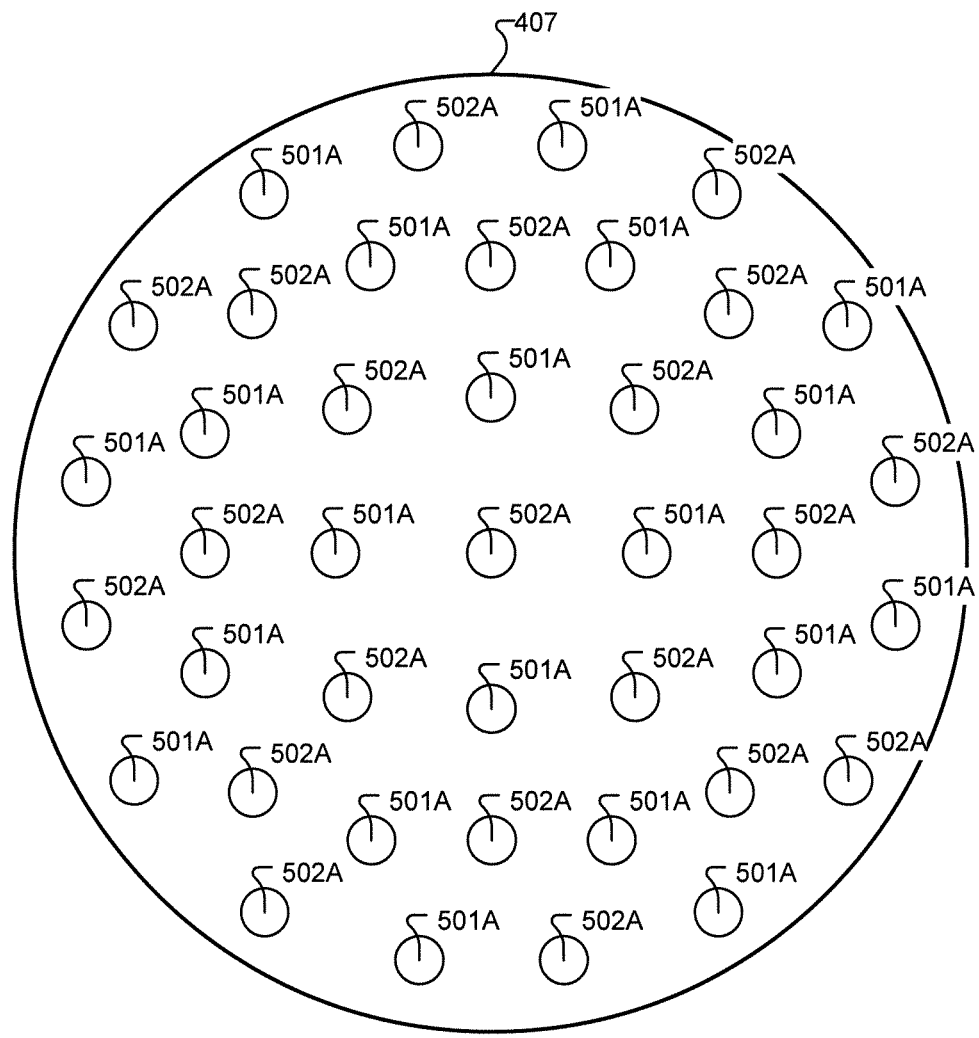
FIG. 4E shows a variation of the horizontal cross-section view of FIG. 4B in which the spacing between the plasma ports associated with the first and second plasma chambers across the top plate assembly is non-uniform, in accordance with one embodiment of the present invention.

It should be appreciated that the spacing between the plasma ports associated with the first and second plasma chambers 501/502 across the top plate assembly 407 can be varied among different embodiments. FIG. 4C shows a variation of the horizontal cross-section view of FIG. 4B in which the spacing between the plasma ports associated with the first and second plasma chambers 501/502 across the top plate assembly 407 is decreased, in accordance with one embodiment of the present invention. FIG. 4D shows a variation of the horizontal cross-section view of FIG. 4B in which the spacing between the plasma ports associated with the first and second plasma chambers 501/502 across the top plate assembly 407 is increased, in accordance with one embodiment of the present invention. FIG. 4E shows a variation of the horizontal cross-section view of FIG. 4B in which the spacing between the plasma ports associated with the first and second plasma chambers 501/502 across the top plate assembly 407 is non-uniform, in accordance with one embodiment of the present invention.

In one embodiment, the first plasma chamber 501 is primarily responsible for supplying radical constituents to the processing region 106, and the second plasma chamber 502 is primarily responsible for supplying ion constituents to the processing region 106. In this embodiment, the large plasma generation volume of the first plasma chamber 501 is used to feed multiple radical constituent dispense ports within the top plate assembly 407. Also, in this embodiment, the large plasma generation volume of the second plasma chamber 502 is used to feed multiple ion constituent dispense ports within the top plate assembly 407. In this embodiment, the multiple radical and ion dispense ports are interspersed with each other to provide a substantially uniform radical/ion mixture within the processing region 106.

The system 500 also includes the first power supply 103A defined to supply power to the first plasma chamber 501, and the first process gas supply 104A defined to supply process gas to the first plasma chamber. Also, the system 500 includes the second power supply 103B defined to supply power to the second plasma chamber 502, and the second process gas supply 104B defined to supply process gas to the second plasma chamber 502. As with the system 400, in the system 500, either the first and second power supplies 103A/103B are independently controllable, or the first and second process gas supplies 104A/104B are independently controllable, or both the first and second power supplies 103A/103B and the first and second process gas supplies 104A/104B are independently controllable. Additionally, in one embodiment, the first and second plasma chambers 501/502 of the system 500 are defined to operate in either a simultaneous manner or a pulsed manner. When operated in the pulsed manner, either the first plasma chamber 501 or the second plasma chamber 502 is operated at a given time, and the first and second plasma chambers 501/502 are operated in an alternating sequence.

Figure 5A:
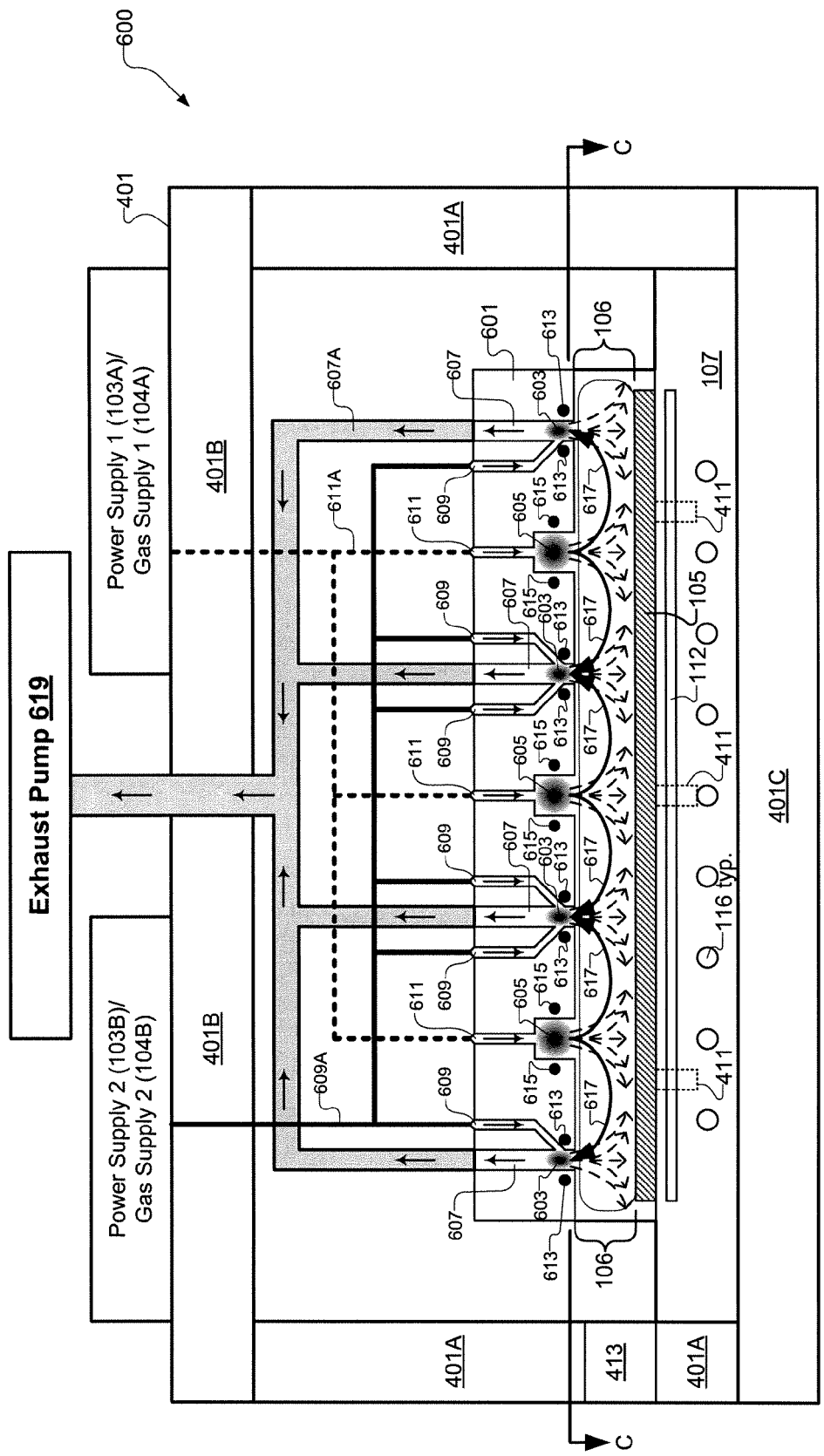
FIG. 5A shows another system for substrate plasma processing, in accordance with one embodiment of the present invention.

FIG. 5A shows another system 600 for substrate plasma processing, in accordance with one embodiment of the present invention. The system 600 is essentially equivalent to the system 400 of FIG. 3A with regard to the chamber 401 and the substrate support 107. However, the system 600 replaces the top plate assembly 407, as previously discussed with regard to FIG. 3A, with a top plate assembly 601 that includes a first set of plasma microchambers 605 and a second set of plasma microchambers 603 formed within exhaust channels 607.

The system 600 includes the chamber 401 having the top structure 401B, the bottom structure 401C, and the sidewalls 401A extending between the top and bottom structures 401B/401C. The chamber 401 also includes the processing region 106. The substrate support 107 is disposed within the chamber 401 and has a top surface defined to support the substrate 105 in exposure to the processing region 106. The top plate assembly 601 is disposed within the chamber 401 above the substrate support 107. The top plate assembly 601 has a lower surface exposed to the processing region 106 and opposite the top surface of the substrate support 107.

The top plate assembly 601 includes the first set of plasma microchambers 605 each formed into the lower surface of the top plate assembly 601. The top plate assembly 601 also includes a first network of gas supply channels 611 formed to flow a first process gas from the first gas supply 104A to each of the first set of plasma microchambers 605. Supply of the first process gas to the first network of gas supply channels 611 is indicated by lines 611A in FIG. 5A. Each of the first set of plasma microchambers 605 is connected to receive power from the first power supply 103A, and is defined to use this received power to transform the first process gas into a first plasma in exposure to the processing region 106. Supply of the first power to the first set of plasma microchambers 605 is also indicated by lines 611A in FIG. 5A.

A first set of power delivery components 615 are respectively disposed within the top plate assembly 601 about the first set of plasma microchambers 605. Each of the first set of power delivery components 615 is connected to receive the first power from the first power supply 103A and supply the first power to its associated one of the first set of plasma microchambers 605. In one embodiment, each of the first set of power delivery components 615 is defined as a coil formed to circumscribe a given one of the first set of plasma microchambers 605. However, it should be understood that in other embodiments the first set of power delivery components 615 can be defined in ways other than a coil. For example, in one embodiment, each of the first set of power delivery components 615 is defined as one or more electrodes configured and disposed to convey the first power to its associated one of the first set of plasma microchambers 605.

The top plate assembly 601 also includes the set of exhaust channels 607 formed through the lower surface of the top plate assembly 601 to provide for removal of exhaust gases from the processing region 106. Each exhaust channel 607 is fluidly connected to an exhaust fluid conveyance system 607A, such as channels, tubing, plenum(s), and the like, which is in turn fluidly connected to an exhaust pump 619. When operated, the exhaust pump 619 applies a suction through the exhaust fluid conveyance system 607A to the set of exhaust channels 607 to remove process gases from the processing region 106. As indicated by arrows 617, the process gases that flow into the processing region 106 through the first set of plasma microchambers 605 are drawn toward and into the exhaust channels 607.

The second set of plasma microchambers 603 are respectively formed inside the set of exhaust channels 607. A second network of gas supply channels 609 is formed to flow a second process gas from the second process gas supply 104B to each of the second set of plasma microchambers 603. Supply of the second process gas to the second network of gas supply channels 609 is indicated by lines 609A in FIG. 5A. Each of the second set of plasma microchambers 603 is connected to receive power from the second power supply 103B, and is defined to use this received power to transform the second process gas into a second plasma in exposure to the processing region 106. Supply of the second power to the second set of plasma microchambers 603 is also indicated by lines 609A in FIG. 5A.

A second set of power delivery components 613 are respectively disposed within the top plate assembly 601 about the second set of plasma microchambers 603. Each of the second set of power delivery components 613 is connected to receive the second power from the second power supply 103B and supply the second power to its associated one of the second set of plasma microchambers 603. In one embodiment, each of the second set of power delivery components 613 is defined as a coil formed to circumscribe a given one of the second set of plasma microchambers 603. However, it should be understood that in other embodiments the second set of power delivery components 613 can be defined in ways other than a coil. For example, in one embodiment, each of the second set of power delivery components 613 is defined as one or more electrodes configured and disposed to convey the second power to its associated one of the second set of plasma microchambers 603.

The electrode 112 within the substrate support 107 is defined to apply a bias voltage across the processing region 106 between the substrate support 107 and the lower surface of the top plate assembly 601. The process gases that flow through the second network of gas supply channels 609 into the second set of plasma microchambers 603, i.e., into the exhaust channels 607, are drawn away from the processing region 106 and do not enter the processing region 106. Therefore, because the second set of plasma microchambers 603 are formed within the exhaust channels 607, the radicals formed within the second set of plasma microchambers 603 will follow the exhaust gas flow path through the exhaust channels 607. However, the ions formed within the second set of plasma microchambers 603 will be pulled into the processing region 106 by the bias voltage applied across the processing region 106 by the electrode 112. In this manner, the second set of plasma microchambers 603 can operate as a substantially pure ion source for the processing region 106.

Figure 5B:
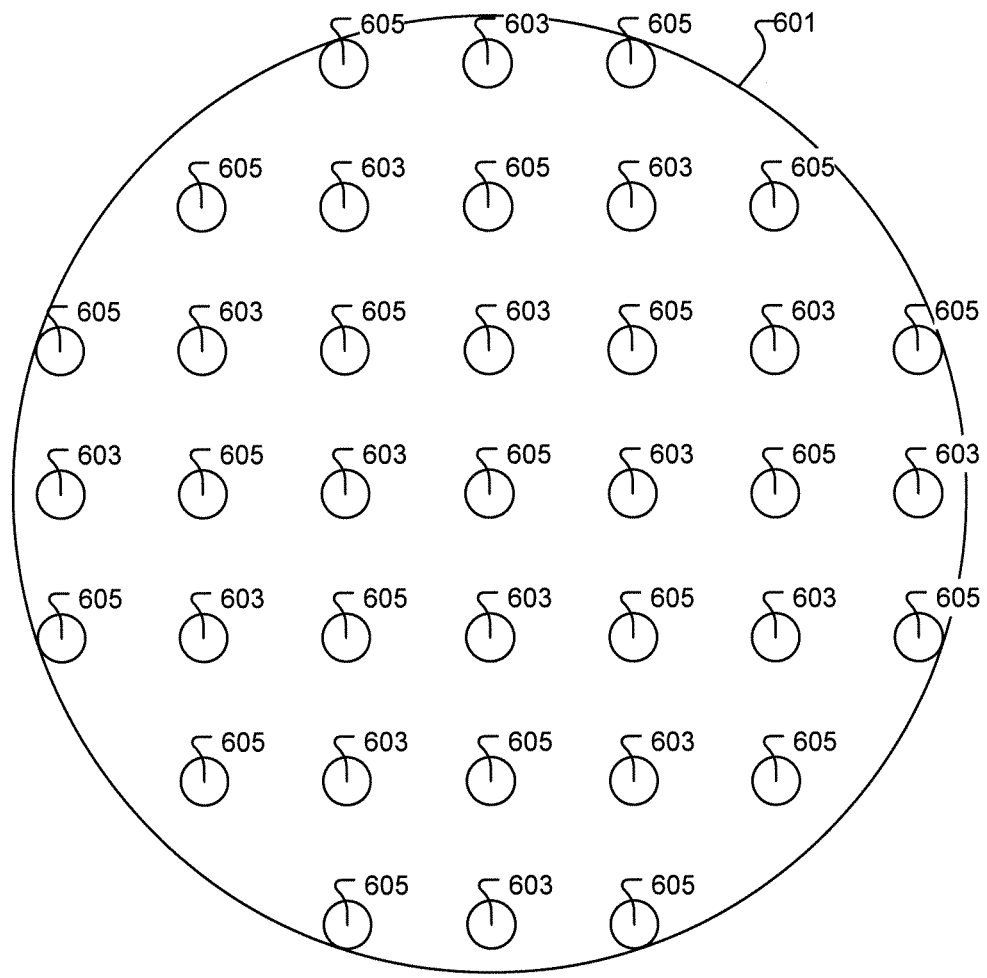
FIG. 5B shows a horizontal cross-section view C-C as referenced in FIG. 5A, in accordance with one embodiment of the present invention.

It should be understood that the first set of plasma microchambers 605 are interspersed with the second set of plasma microchambers 603 in a substantially uniform manner across the lower surface of the top plate assembly 601. In this manner, the reactive radical constituents from the first set of plasma microchambers 605 can be mixed in a substantially uniform manner with the ion constituents from the second set of plasma microchambers 603 within the processing region 106 prior to reaching the substrate 105. FIG. 5B shows a horizontal cross-section view C-C as referenced in FIG. 5A, in accordance with one embodiment of the present invention. As shown in FIG. 5B, the first and second sets of plasma microchambers 605/603 are distributed in a substantially uniform manner across the lower surface of the top plate assembly 601.

Figure 5C:
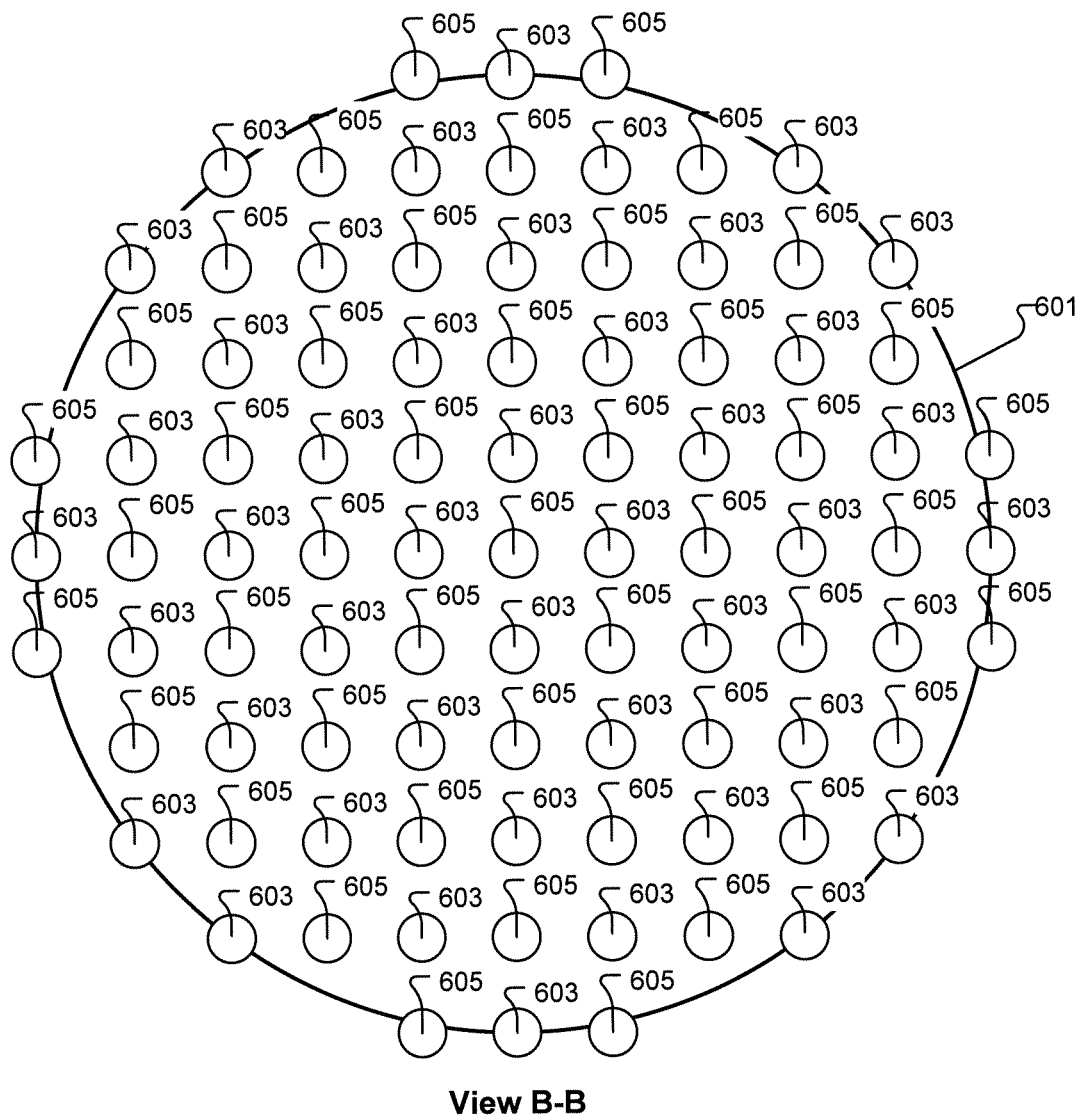
FIG. 5C shows a variation of the horizontal cross-section view of FIG. 5B in which the spacing between the first and second sets of plasma microchambers across the lower surface of the top plate assembly is decreased, in accordance with one embodiment of the present invention.
Figure 5D:
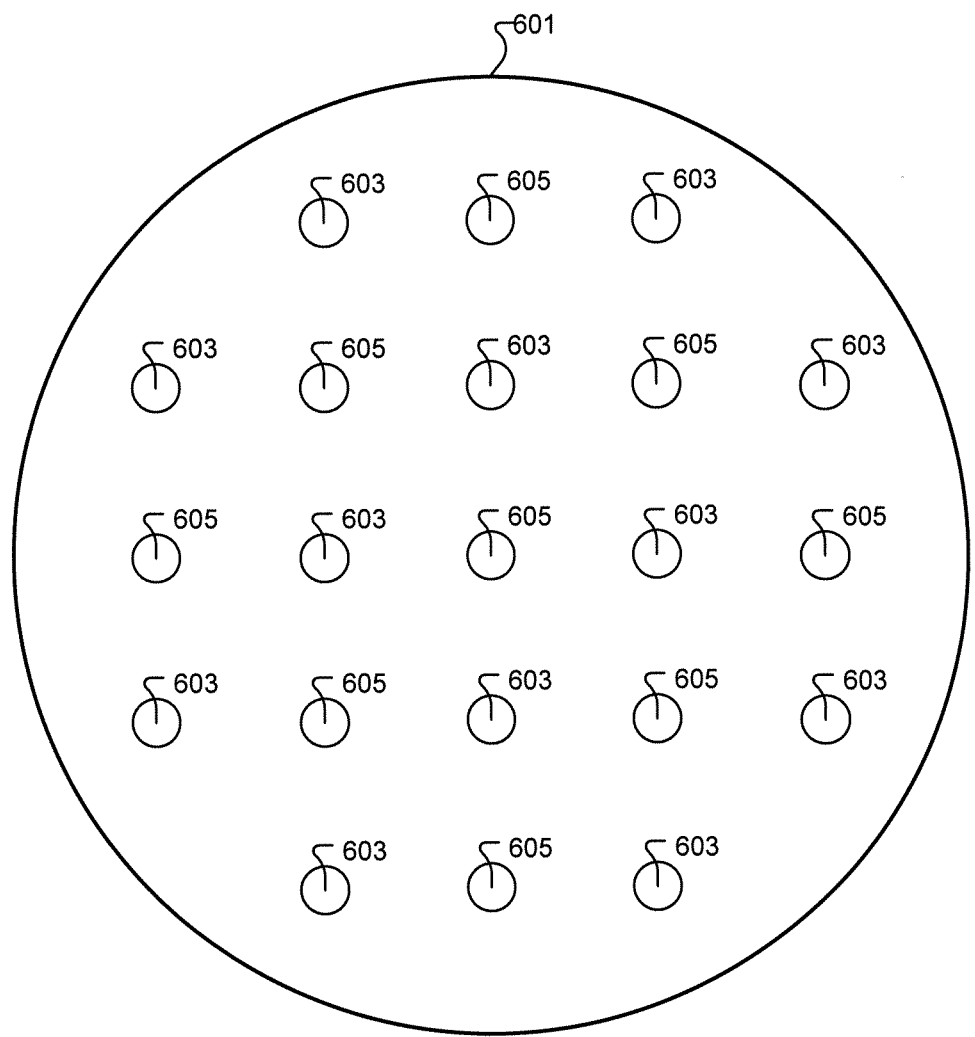
FIG. 5D shows a variation of the horizontal cross-section view of FIG. 5B in which the spacing between the first and second sets of plasma microchambers across the lower surface of the top plate assembly is increased, in accordance with one embodiment of the present invention.
Figure 5E:
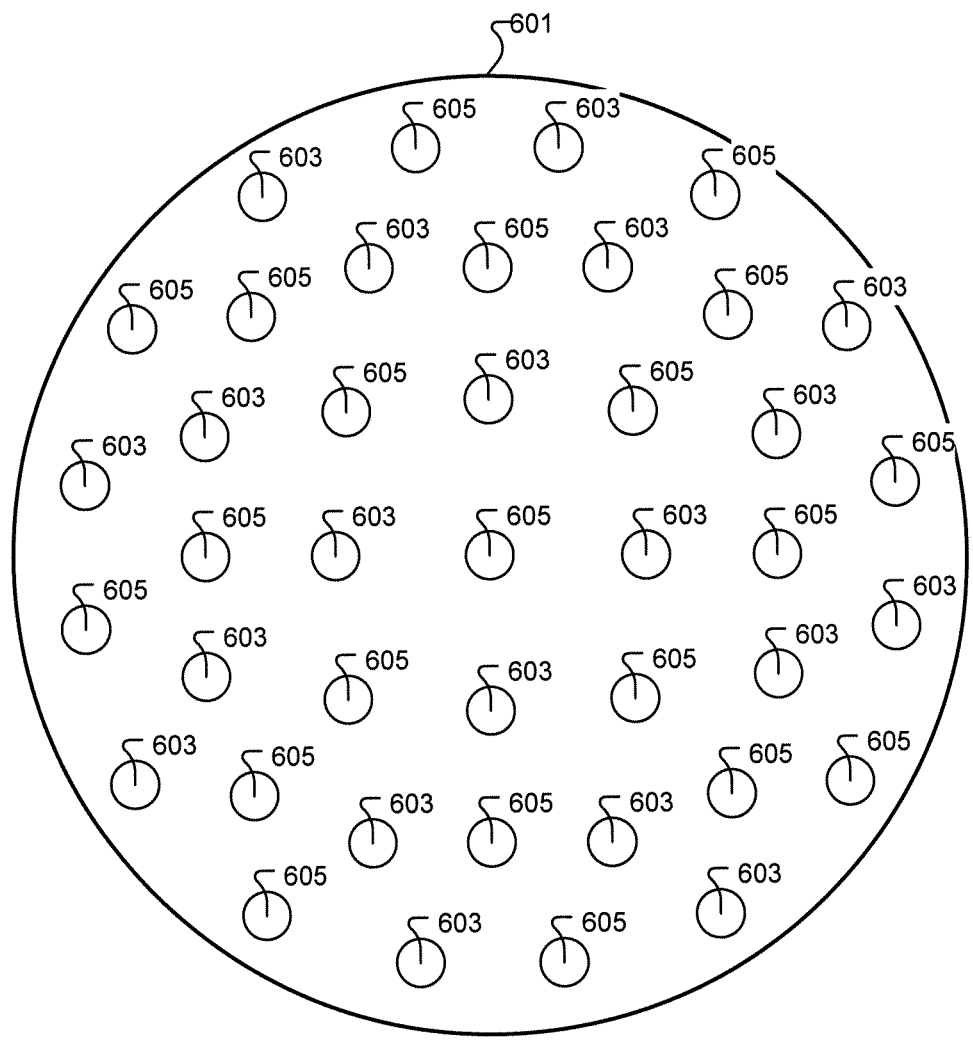
FIG. 5E shows a variation of the horizontal cross-section view of FIG. 5B in which the spacing between the first and second sets of plasma microchambers across the lower surface of the top plate assembly is non-uniform, in accordance with one embodiment of the present invention.

It should be appreciated that the spacing between the first and second sets of plasma microchambers 605/603 across the lower surface of the top plate assembly 601 can be varied among different embodiments. FIG. 5C shows a variation of the horizontal cross-section view of FIG. 5B in which the spacing between the first and second sets of plasma microchambers 605/603 across the lower surface of the top plate assembly 601 is decreased, in accordance with one embodiment of the present invention. FIG. 5D shows a variation of the horizontal cross-section view of FIG. 5B in which the spacing between the first and second sets of plasma microchambers 605/603 across the lower surface of the top plate assembly 601 is increased, in accordance with one embodiment of the present invention. FIG. 5E shows a variation of the horizontal cross-section view of FIG. 5B in which the spacing between the first and second sets of plasma microchambers 605/603 across the lower surface of the top plate assembly 601 is non-uniform, in accordance with one embodiment of the present invention.

As with the embodiments of FIGS. 2A-2G, 3A-3E, 4A-4E, in the embodiments of FIGS. 5A-5E, the first and second power supplies 103A/103B and the first and second gas supplies 104A/104B can be controlled in a variety of ways. In one embodiment, the first and second power supplies 103A/103B are independently controllable. In one embodiment, the first and second process gas supplies 104A/104B are independently controllable. In yet another embodiment, both the first and second power supplies 103A/103B and the first and second process gas supplies 104A/104B are independently controllable. In following, it should be understood that the first and second sets of plasma microchambers 605/603 are defined to operate in either a simultaneous manner or a pulsed manner. When operated in the pulsed manner, either the first set of plasma microchambers 605 or the second set of plasma microchambers 603 is operated at a given time, and the first and second sets of plasma microchambers 605/603 are operated in an alternating sequence.

Given the embodiment of FIG. 5A, it should be appreciated that the drivers which allow a plasma to escape from its generation region, e.g., ambipolar diffusion, can be made opposite the drivers which allow radicals to escape into the plasma region by reversing the process gas flow direction. Adding top pumping to the ion sources, i.e., to the second set of plasma microchambers 603, facilitates both more efficient ion extraction (wider openings) and a larger ion/neutral flux ratio from the plasma source itself. Additionally, it should be understood that in one embodiment the chamber 401 of FIG. 5A can be further equipped with the peripheral vents 427, flow throttling device 433, exhaust ports 429, and exhaust pump 431, as previously described with regard to the embodiments of FIGS. 3A and 4A, to enable peripheral exhaust flow in addition to the top exhaust flow through the exhaust channels 607.

In the various embodiments disclosed herein, the different ion and radical plasma sources can be process controlled with regard to gas flow, gas pressure, power frequency, power amplitude, on duration, off duration, and timing sequence. Also, the different types of plasma sources can be pulsed to mitigate communication between neighboring plasma sources. The two different plasma source types can also be operated using different gas mixtures in order to achieve a condition of a higher flux of ions from one plasma source and a higher flux of radicals from the other plasma source. With the mixed array of ion and radical plasma sources, in one embodiment, each plasma source can be connected to its own separately controlled power and gas supplies. Also, in another embodiment, all ion plasma sources in the mixed array can be connected to a common gas supply and a common power supply, and all radical plasma source in the mixed array can be connected to another common gas supply and another common power supply.

In one embodiment, the system 600 of FIG. 5A represents a semiconductor substrate processing system having a plate assembly 601 that has a process-side surface exposed to the plasma processing region 601. The plate assembly 601 includes an exhaust channel 607 formed through the process-side surface of the plate assembly 601 to provide for removal of exhaust gases from the plasma processing region 601. The plasma microchamber 603 is formed inside the exhaust channel. The gas supply channel 609 is formed through the plate assembly 601 to flow a process gas to the plasma microchamber 603 in the exhaust channel 607. A power delivery component 613 is formed within the plate assembly 601 to transmit power to the plasma microchamber region 603, so as to transform the process gas into a plasma within the plasma microchamber 603 in the exhaust channel 607.

In one embodiment, the power supplied to the power delivery component 613 is either DC power, RF power, or a combination of DC and RF power. In one embodiment, the power supplied to the power delivery component 613 is RF power having a frequency of either 2 MHz, 27 MHz, 60 MHz, or 400 kHz. In one embodiment the power delivery component 613 is defined as a coil formed within the plate assembly 601 to circumscribe the plasma microchamber 603 in the exhaust channel 607.

The system 600 also includes an electrode 112 disposed outside of the plate assembly 601 that when energized causes ions to be attracted from the plasma microchamber 603 in the exhaust channel 607 into the plasma processing region 106. In one embodiment, the electrode 112 is disposed within the substrate support 107, with the substrate support 107 disposed to support the substrate 105 in exposure to the plasma processing region 106. Also, in one embodiment, the exhaust channel 607 is defined to remove gases from the processing region 106 in a direction substantially perpendicular to and away from a surface of the substrate support 107 upon which the substrate 105 is to be supported.

Figure 6:
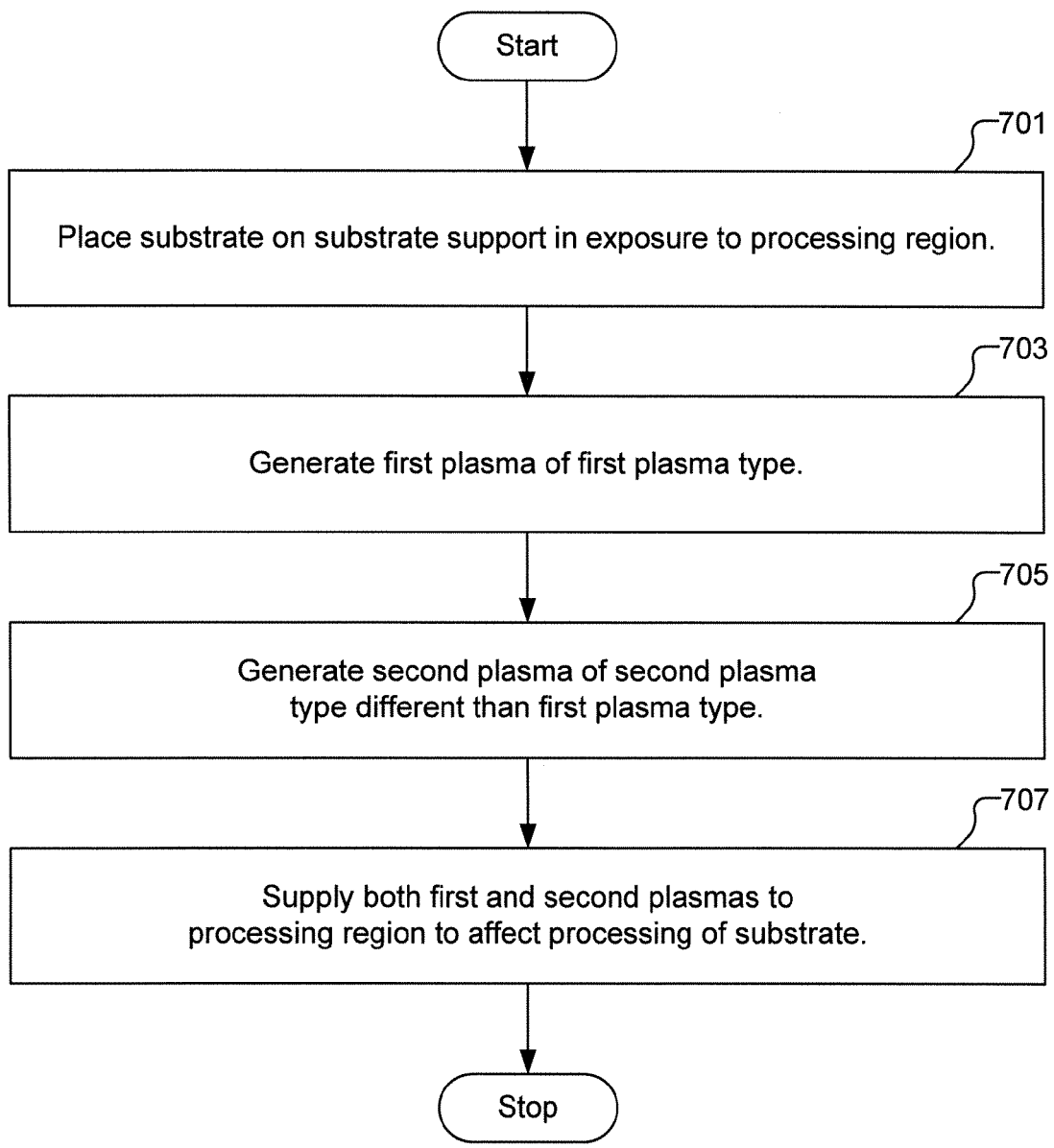
FIG. 6 shows a flowchart of a method for processing a semiconductor substrate, in accordance with one embodiment of the present invention.

FIG. 6 shows a flowchart of a method for processing a semiconductor substrate, in accordance with one embodiment of the present invention. The method includes an operation 701 for placing a substrate 105 on a substrate support 107 in exposure to a processing region 106. The method also includes an operation 703 for generating a first plasma 101A of a first plasma type. The method also includes an operation 705 for generating a second plasma 102A of a second plasma type different than the first plasma type. The method also includes an operation 707 for supplying reactive constituents 108A/108B of both the first and second plasmas 101A/102A to the processing region 106 to affect a processing of the substrate 105.

The method also includes operations for using a first power and a first process gas to generate the first plasma 101A, and using a second power and a second process gas to generate the second plasma 102A. In one embodiment, the method includes an operation for independently controlling either the first and second powers, or the first and second process gases, or both the first and second powers and the first and second process gases. Also, in one embodiment, the first power is either DC power, RF power, or a combination of DC and RF power, and the second power is either DC power, RF power, or a combination of DC and RF power. In one example embodiment, the first power is RF power having a first frequency of either 2 MHz, 27 MHz, 60 MHz, or 400 kHz, and the second power is RF power having a second frequency of either 2 MHz, 27 MHz, 60 MHz, or 400 kHz, with the second frequency being different than the first frequency.

In the method, the first plasma 101A is generated to have a first ratio of ion density to radical density, and the second plasma 102A is generated to have a second ratio of ion density to radical density. The second ratio of ion density to radical density in the second plasma 102A is different than the first ratio of ion density to radical density in the first plasma 101A. In the method, reactive constituents from both the first and second plasmas 101A/102A are supplied in a substantially uniform manner throughout the processing region 106 in exposure to the substrate 105. Also, in various embodiments, reactive constituents from the first and second plasmas 101A/102A are generated and supplied in either a simultaneous manner or a pulsed manner. Generation and supply of the first and second plasmas 101A/102A in the pulsed manner includes generation and supply of reactive constituents of either the first plasma 101A or the second plasma 102A at a given time and in an alternating sequence.

The method can also include an operation for generating supplemental electrons to increase ion extraction from one or both of the first and second plasmas 101A/102A into the processing region 106, such as described with regard to FIG. 2D. Also, the method can include an operation for applying a bias voltage across the processing region 106 from the substrate support 107, so as to attract ions from one or both of the first and second plasmas 101A/102A toward the substrate 105, such as described herein with regard to operation of the electrode 112.

Additionally, in one embodiment, the method can include an operation for positioning a baffle structure 109 between a first port through which reactive constituents of the first plasma 101A are supplied to the processing region 106 and a second port through which reactive constituents of the second plasma 102A are supplied to the processing region 106. In this embodiment, the method can also include an operation for controlling a position of the baffle structure 109 relative to the substrate support 107, so as to limit one or both of fluid communication and power communication between the first and second ports through which the reactive constituents of the first and second plasma 101A/102A are emitted into the processing region 106.

Figure 7:
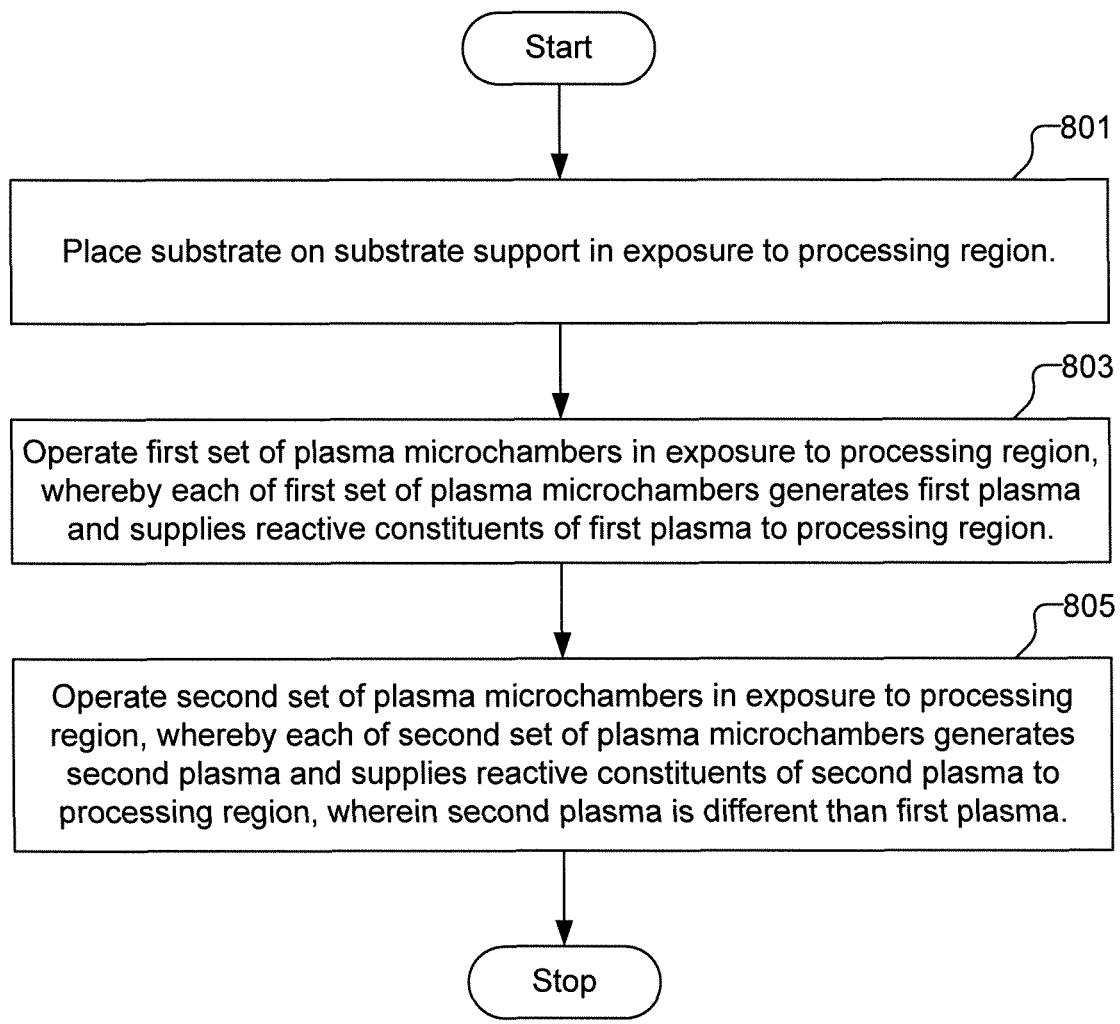
FIG. 7 shows a flowchart of a method for processing a semiconductor substrate, in accordance with one embodiment of the present invention.

FIG. 7 shows a flowchart of a method for processing a semiconductor substrate, in accordance with one embodiment of the present invention. The method includes an operation 801 for placing a substrate 105 on a substrate support 107 in exposure to a processing region 106. The method also includes an operation 803 for operating a first set of plasma microchambers 605 in exposure to the processing region 106, whereby each of the first set of plasma microchambers 605 generates a first plasma and supplies reactive constituents of the first plasma to the processing region 106. The first set of plasma microchambers 605 are located above the processing region 106 opposite from the substrate support 107. The method also includes an operation 805 for operating a second set of plasma microchambers 603 in exposure to the processing region 106, whereby each of the second set of plasma microchambers 603 generates a second plasma and supplies reactive constituents of the second plasma to the processing region 106. The second plasma is different than the first plasma. Also, the second set of plasma microchambers 603 are located above the processing region 106 opposite from the substrate support 107, and are interspersed in a substantially uniform manner among the first set of plasma microchambers 605.

The method further includes operations for supplying a first power to the first set of plasma microchambers 605, supplying a first process gas to the first set of plasma microchambers 605, supplying a second power to the second set of plasma microchambers 603, and supplying a second process gas to the second set of plasma microchambers 603. In various embodiments, the method includes an operation for independently controlling either the first and second powers, or the first and second process gases, or both the first and second powers and the first and second process gases. In one embodiment, the first power is either DC power, RF power, or a combination of DC and RF power, and the second power is either DC power, RF power, or a combination of DC and RF power. In one example embodiment, the first power is RF power having a first frequency of either 2 MHz, 27 MHz, 60 MHz, or 400 kHz, and the second power is RF power having a second frequency of either 2 MHz, 27 MHz, 60 MHz, or 400 kHz, with the second frequency being different than the first frequency.

The method further includes an operation for removing exhaust gases from the processing region 106 through a set of exhaust channels 607 defined to remove gases from the processing region 106 in a direction substantially perpendicular to and away from a top surface of the substrate support 107 upon which the substrate 105 is placed. In one embodiment, the second set of plasma microchambers 603 are respectively defined inside the set of exhaust channels 607.

The method includes operating the first set of plasma microchambers 605 to generate the first plasma to have a first ratio of ion density to radical density, and operating the second set of plasma microchambers 603 to generate the second plasma to have a second ratio of ion density to radical density, with the second ratio of ion density to radical density in the second plasma being different than the first ratio of ion density to radical density in the first plasma. Also, in the embodiment where the second set of plasma microchambers 603 are respectively defined inside the set of exhaust channels 607, the first plasma has a higher radical density than ion density, and the second plasma has a higher ion density than radical density.

In one embodiment, the method includes operation of the first and second sets of plasma microchambers 605/603 in a simultaneous manner. In another embodiment, the first and second sets of plasma microchambers 605/603 are operated in a pulsed manner in which either the first set of plasma microchambers 605 or the second set of plasma microchambers 603 are operated at a given time, and in which the first and second sets of plasma microchambers 605/603 are operated in an alternating sequence. Additionally, the method can include an operation for applying a bias voltage across the processing region 106 from the substrate support 107, so as to attract ions from one or both of the first and second plasmas respectively generated within the first and second sets of plasma microchambers 605/603 toward the substrate 105, such as discussed herein with regard to the electrode 112.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A semiconductor substrate processing system, comprising:
   a chamber having a top structure, a bottom structure, and sidewalls extending between the top and bottom structures, the chamber including a processing region;
   a substrate support disposed within the chamber, the substrate support having a top surface defined to support a substrate in exposure to the processing region;
   a top plate assembly disposed within the chamber above the substrate support, the top plate assembly having a lower surface exposed to the processing region and opposite the top surface of the substrate support, the top plate assembly including:
      a first set of plasma microchambers each formed into the lower surface of the top plate assembly,
      a first network of gas supply channels formed to flow a first process gas to each of the first set of plasma microchambers, each of the first set of plasma microchambers defined to transform the first process gas into a first plasma in exposure to the processing region,
      a set of exhaust channels formed through the lower surface of the top plate assembly to provide for removal of exhaust gases from the processing region,
      a second set of plasma microchambers respectively formed inside the set of exhaust channels, and
      a second network of gas supply channels formed to flow a second process gas to each of the second set of plasma microchambers, each of the second set of plasma microchambers defined to transform the second process gas into a second plasma in exposure to the processing region.

2. A semiconductor substrate processing system as recited in claim 1, wherein the first set of plasma microchambers are interspersed with the second set of plasma microchambers in a substantially uniform manner across the lower surface of the top plate assembly.

3. A semiconductor substrate processing system as recited in claim 1, further comprising:
   a first power supply defined to supply a first power to the first set of plasma microchambers;
   a first process gas supply defined to supply a first process gas to the first network of gas supply channels;
   a second power supply defined to supply a second power to the second set of plasma microchambers; and
   a second process gas supply defined to supply a second process gas to the second network of gas supply channels.

4. A semiconductor substrate processing system as recited in claim 3, wherein either the first and second power supplies are independently controllable, or the first and second process gas supplies are independently controllable, or both the first and second power supplies and the first and second process gas supplies are independently controllable.

5. A semiconductor substrate processing system as recited in claim 3, further comprising:
   a first set of power delivery components respectively disposed within the top plate assembly about the first set of plasma microchambers, each of the first set of power delivery components connected to receive the first power from the first power supply; and
   a second set of power delivery components respectively disposed within the top plate assembly about the second set of plasma microchambers, each of the second set of power delivery components connected to receive the second power from the second power supply.

6. A semiconductor substrate processing system as recited in claim 5, wherein each power delivery component of the first set of power delivery components is defined as a respective coil.

7. A semiconductor substrate processing system as recited in claim 5, wherein each power delivery component of the second set of power delivery components is defined as a respective coil.

8. A semiconductor substrate processing system as recited in claim 1, wherein the first and second sets of plasma microchambers are defined to operate in either a simultaneous manner or a pulsed manner, wherein the pulsed manner includes either the first set of plasma microchambers or the second set of plasma microchambers operating at a given time and in an alternating sequence.

9. A semiconductor substrate processing system as recited in claim 1, wherein the substrate support is defined to be movable in a direction perpendicular to both the top surface of the substrate support upon which the substrate is to be supported and the lower surface of the top plate assembly.

10. A semiconductor substrate processing system as recited in claim 1, wherein the substrate support includes an electrode defined to apply a bias voltage across the processing region between the substrate support and the lower surface of the top plate assembly.

11. A semiconductor substrate processing system as recited in claim 1, wherein each plasma microchamber of the first set of plasma microchambers is formed in part by a respective cavity recess defined to extend from the lower surface of the top plate assembly into the top plate assembly.

12. A semiconductor substrate processing system as recited in claim 1, wherein each plasma microchamber of the first set of plasma microchambers includes a respective outlet of the first network of gas supply channels.

13. A semiconductor substrate processing system as recited in claim 1, wherein each plasma microchamber of the second set of plasma microchambers is formed in part by a portion of a respective exhaust channel located adjacent to an inlet of the respective exhaust channel at the lower surface of the top plate assembly.

14. A semiconductor substrate processing system as recited in claim 1, wherein each plasma microchamber of the second set of plasma microchambers includes a respective outlet of the second network of gas supply channels.

15. A semiconductor substrate processing system as recited in claim 1, wherein the second network of gas supply channels is formed physically separate from the first network of gas supply channels, such that the first and second networks of gas supply channels are fluidly isolated from each other upstream of the first and second sets of plasma microchambers.

16. A semiconductor substrate processing system as recited in claim 1, wherein first process gas is fluidly isolated from the second process gas upstream of the first and second sets of plasma microchambers.

17. A semiconductor substrate processing system as recited in claim 1, wherein each exhaust channel of the set of exhaust channels is formed to extend through an entirety of the top plate assembly in a direction perpendicular to the lower surface of the top plate assembly.

18. A semiconductor substrate processing system as recited in claim 17, wherein a portion of each gas supply channel of the second network of gas supply channels is formed to extend through a portion of the top plate assembly in an angled direction to a respective exhaust channel of the set of exhaust channels.

19. A semiconductor substrate processing system as recited in claim 1, further comprising:

an exhaust pump connected to apply fluid suction to the set of exhaust channels.

* * * * *